(12) United States Patent  
Abadeer et al.

(10) Patent No.: US 7,939,911 B2
(45) Date of Patent: May 10, 2011

(54) BACK-END-OF-LINE RESISTIVE SEMICONDUCTOR STRUCTURES

(75) Inventors: Wagdi W. Abadeer, Jericho, VT (US); Kiran V. Chatty, Williston, VT (US); Robert J. Gauthier, Jr., Hinesburg, VT (US); Jed H. Rankin, Richmond, VT (US); Robert Robison, Colchester, VT (US); Yun Shi, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 12/191,683

(22) Filed: Aug. 14, 2008

(65) Prior Publication Data

US 2010/0038754 A1 Feb. 18, 2010

(51) Int. Cl.
*H01L 29/00* (2006.01)
(52) U.S. Cl. .......... 257/538; 257/E21.004; 257/E29.001
(58) Field of Classification Search ....... 7/538, E29.001, 7/E21.004; 257/538, E29.001, E21.004
See application file for complete search history.

(56) References Cited

U.S. PATENT DOCUMENTS

| 4,497,685 | A | 2/1985 | Soclof |
| 4,506,283 | A | 3/1985 | Socof |
| 4,950,619 | A | 8/1990 | Yoon et al. |
| 5,140,299 | A | 8/1992 | Andrews, Jr. et al. |
| 5,817,572 | A * | 10/1998 | Chiang et al. .............. 438/624 |
| 6,271,084 | B1 * | 8/2001 | Tu et al. .................... 438/253 |
| 6,373,118 | B1 | 4/2002 | Lewyn |
| 6,573,585 | B2 | 6/2003 | Arndt et al. |
| 6,611,039 | B2 * | 8/2003 | Anthony ..................... 257/529 |
| 6,690,083 | B1 | 2/2004 | Mitchell et al. |
| 6,784,045 | B1 | 8/2004 | Price et al. |
| 6,849,561 | B1 * | 2/2005 | Goundar ..................... 438/765 |
| 6,897,528 | B2 | 5/2005 | Al-Sarawi |
| 7,344,940 | B2 * | 3/2008 | Kim et al. .................. 438/253 |
| 7,569,845 | B2 | 8/2009 | Chen et al. |
| 7,704,873 | B1 * | 4/2010 | Yu et al. .................... 438/622 |
| 2007/0029676 | A1 | 2/2007 | Takaura et al. |
| 2008/0067621 | A1 | 3/2008 | Chang et al. |
| 2008/0079102 | A1 | 4/2008 | Chen et al. |
| 2008/0087921 | A1 * | 4/2008 | Yu et al. ..................... 257/213 |
| 2008/0237588 | A1 * | 10/2008 | Lehr ............................ 257/48 |
| 2009/0011560 | A1 * | 1/2009 | Aritome ..................... 438/257 |

* cited by examiner

*Primary Examiner* — David S Blum
(74) *Attorney, Agent, or Firm* — Scully, Scott, Murphy & Presser, P.C.; Anthony J. Canale

(57) ABSTRACT

In one embodiment, a back-end-of-line (BEOL) resistive structure comprises a second metal line embedded in a second dielectric layer and overlying a first metal line embedded in a first dielectric layer. A doped semiconductor spacer or plug laterally abutting sidewalls of the second metal line and vertically abutting a top surface of the first metal line provides a resistive link between the first and second metal lines. In another embodiment, another BEOL resistive structure comprises a first metal line and a second metal line are embedded in a dielectric layer. A doped semiconductor spacer or plug laterally abutting the sidewalls of the first and second metal lines provides a resistive link between the first and second metal lines.

20 Claims, 23 Drawing Sheets

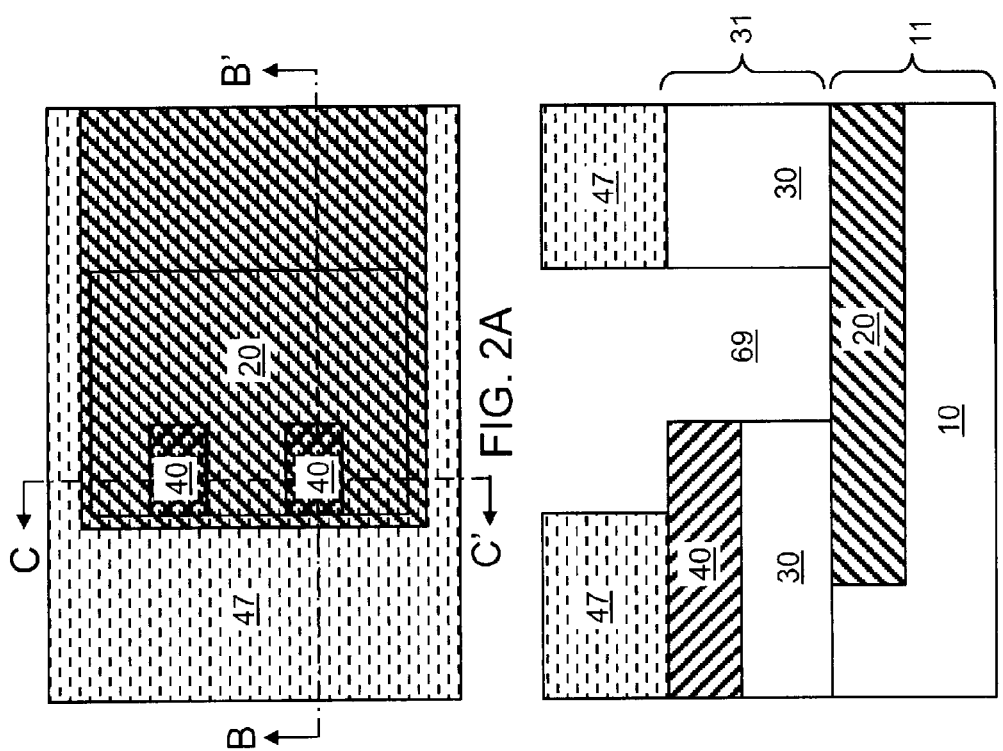
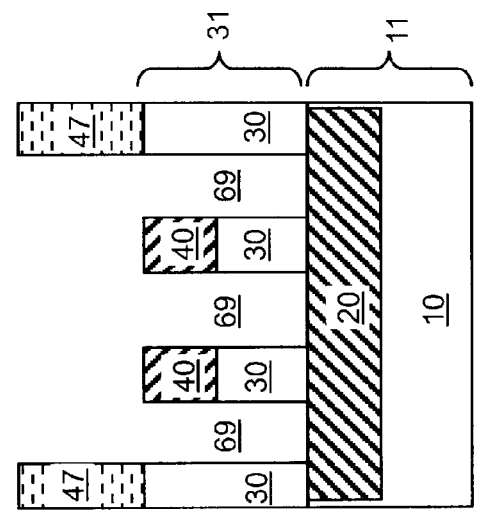
FIG. 2A
FIG. 2B
FIG. 2C

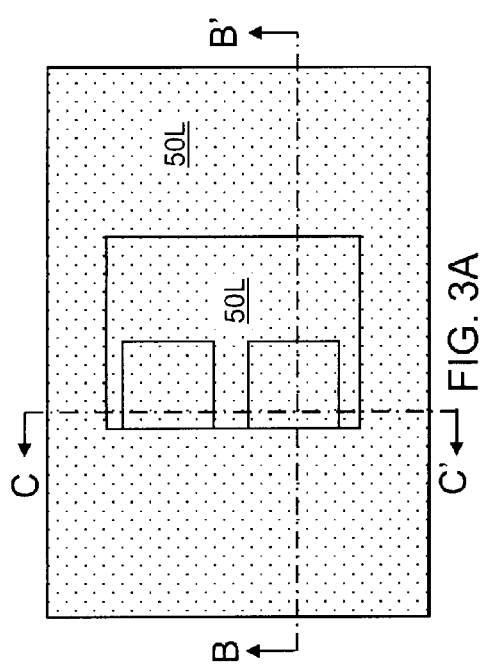
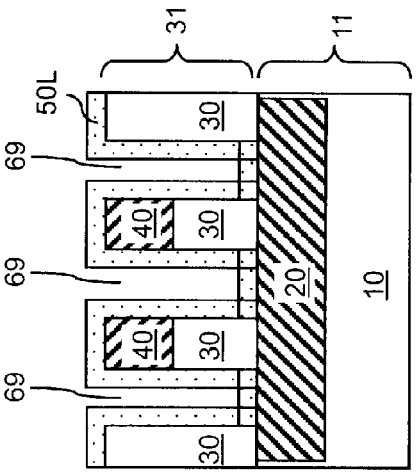
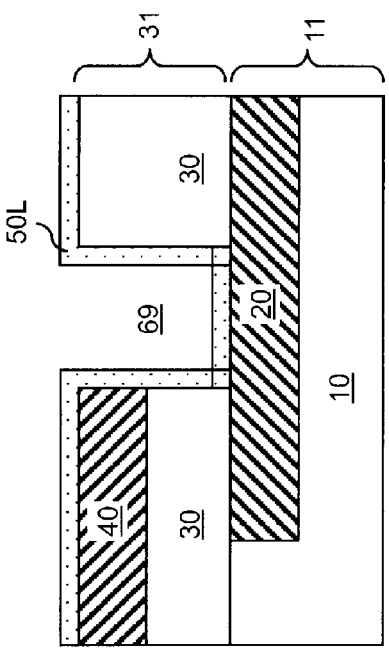
FIG. 3A
FIG. 3B
FIG. 3C

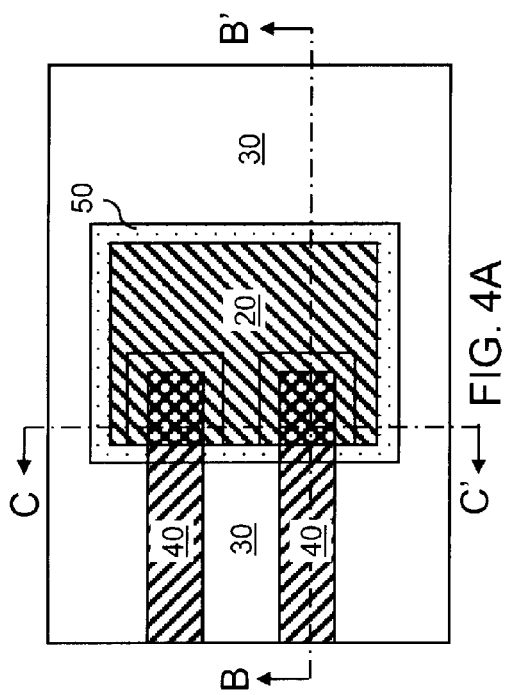
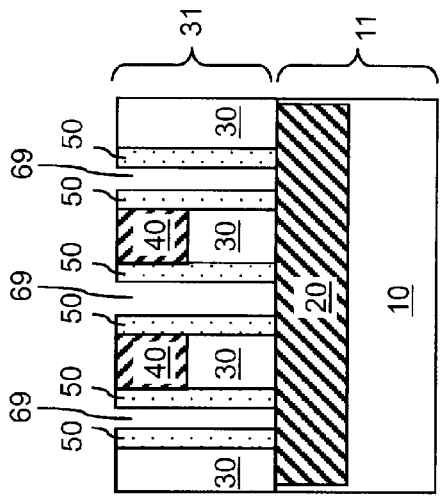
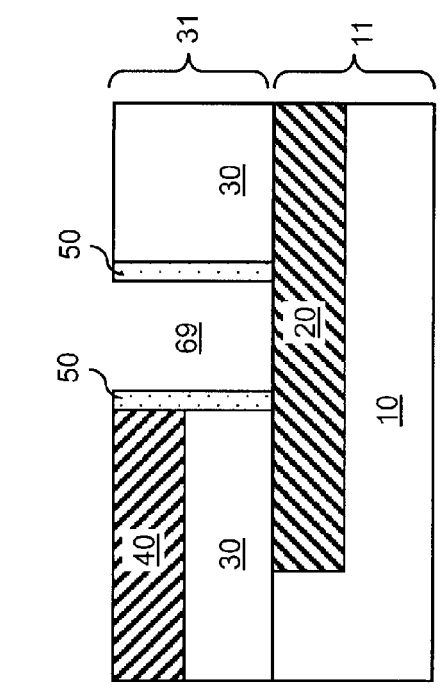

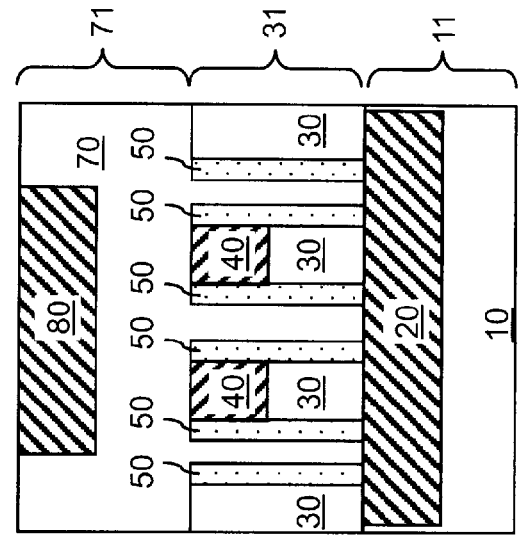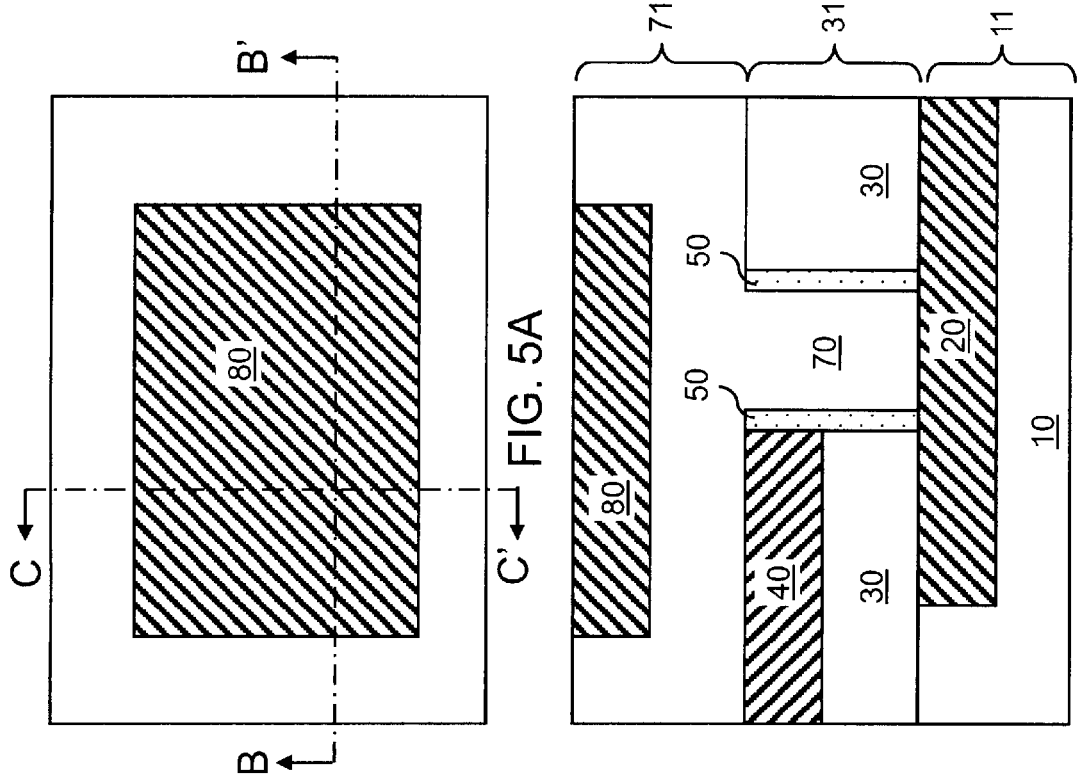

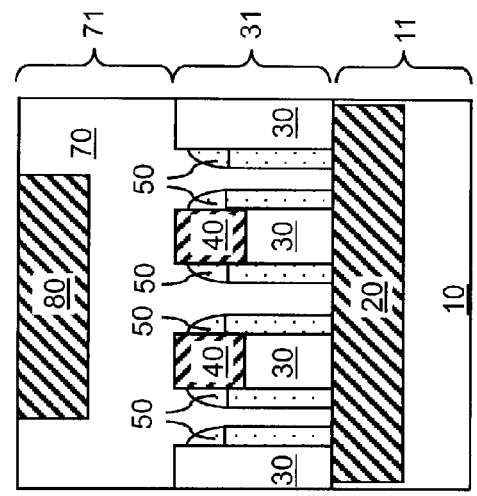
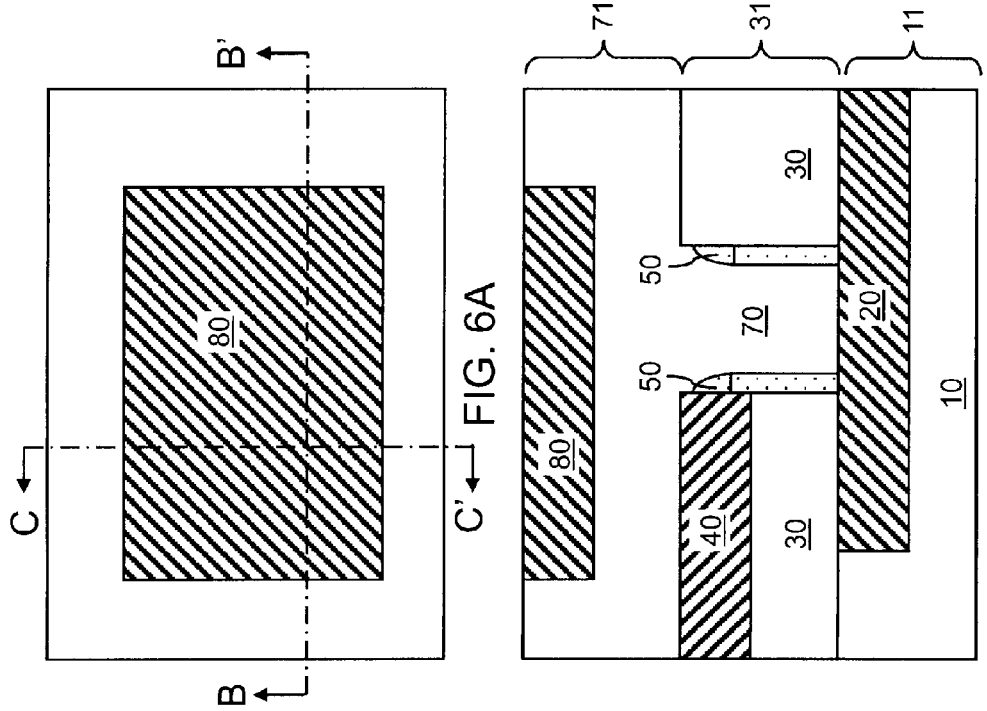
FIG. 6A
FIG. 6B
FIG. 6C

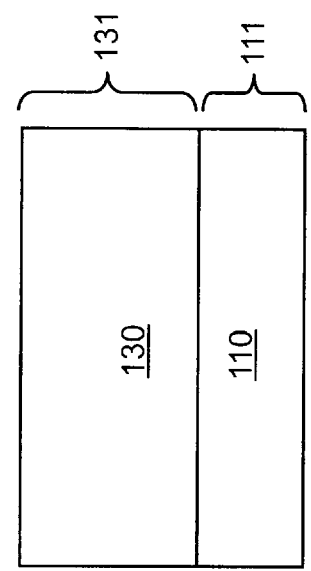
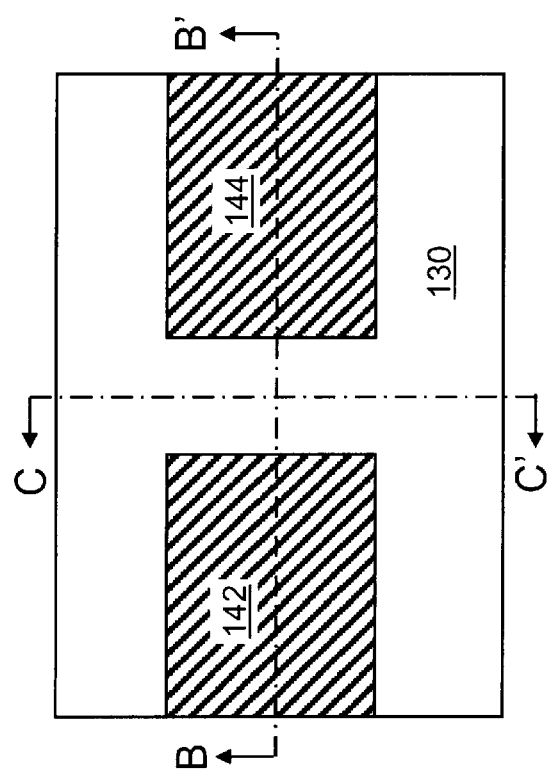
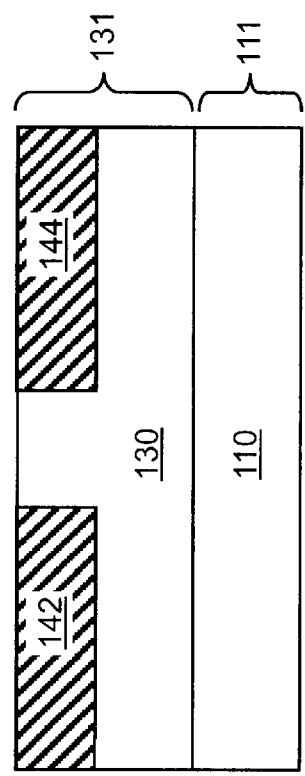

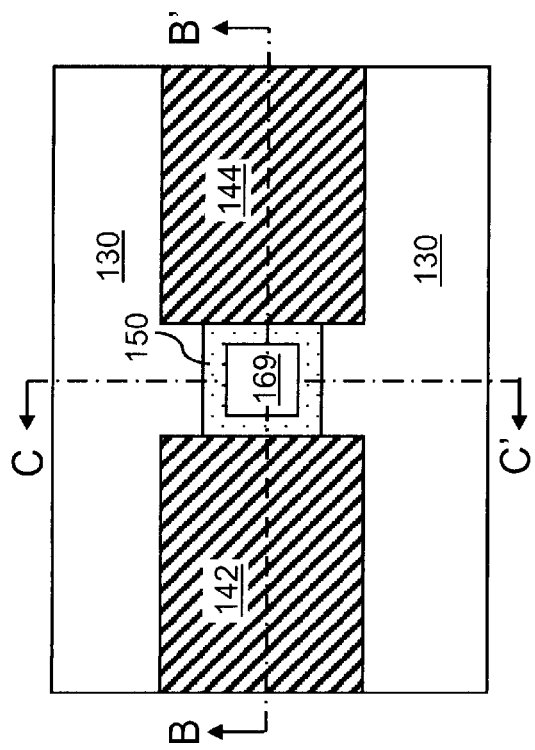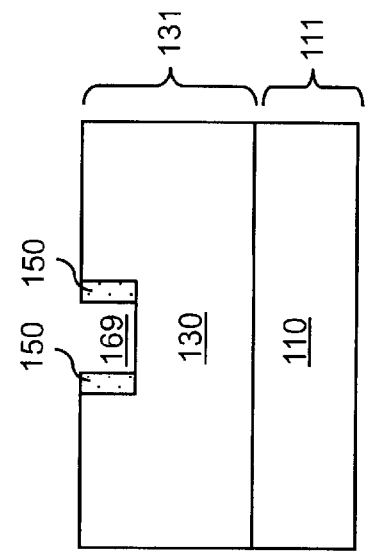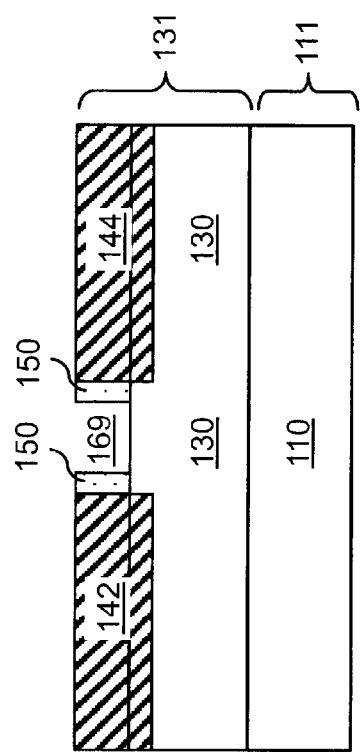
FIG. 15A
FIG. 15B
FIG. 15C

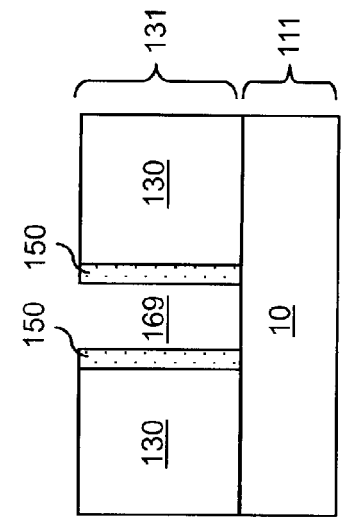
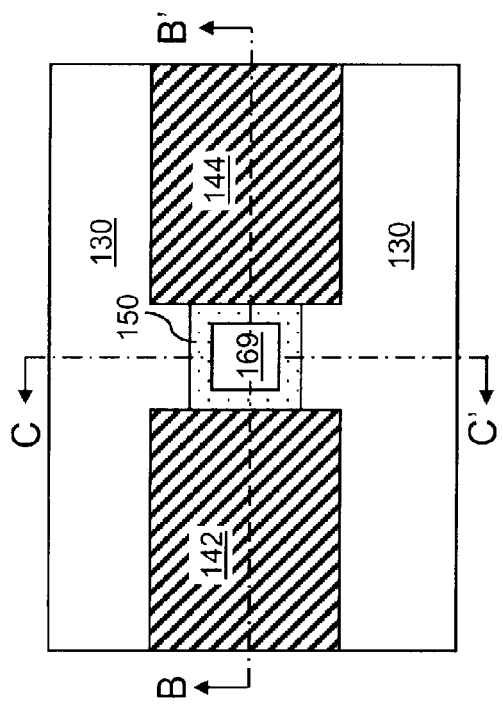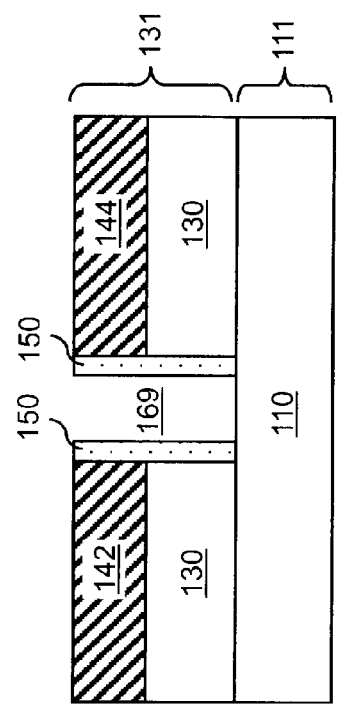
FIG. 18A
FIG. 18B
FIG. 18C

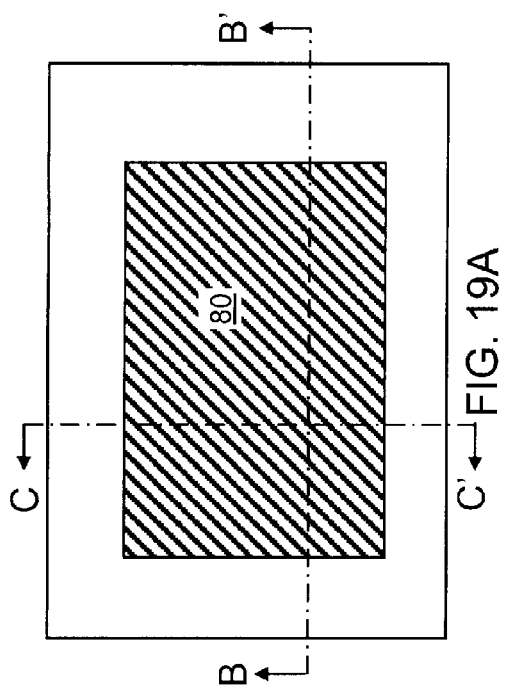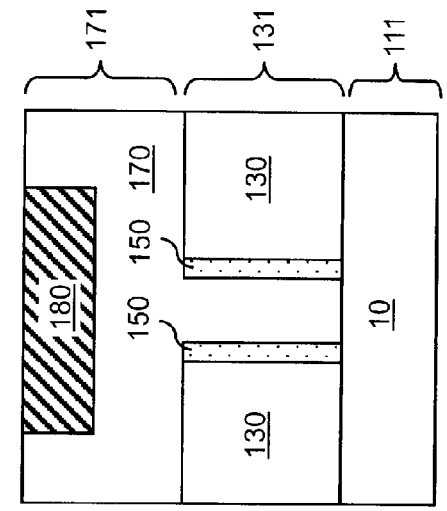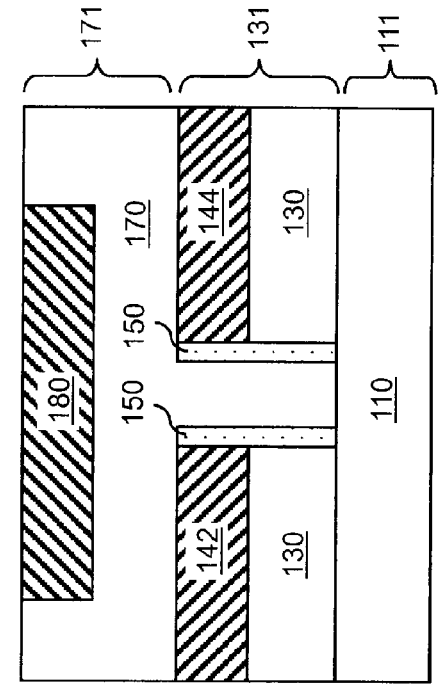

BACK-END-OF-LINE RESISTIVE SEMICONDUCTOR STRUCTURES

CROSS-REFERENCE TO RELATED APPLICATIONS

The present application is related to co-pending U.S. application Ser. No. 12/191,633, which is incorporated herein by reference.

BACKGROUND OF THE INVENTION

The present invention relates to semiconductor structures, and particularly to a back-end-of-line (BEOL) resistive structure comprising a doped semiconductor material, and design structures for the same.

Doped semiconductor materials are employed to form high resistivity elements in semiconductor devices such as a resistor or an electrical fuse. A resistor is a resistive circuit element that maintains a constant resistance value, and may be used in an RC circuit or any other circuit that requires an element with a constant resistance. An electrical fuse is a resistive circuit element that may change the value of the resistance upon programming. For example, when high electrical current flows through an electrical fuse, the material of the electrical fuse may be electromigrated or ruptured, thereby raising the resistance of the electrical fuse typically at least by an order of magnitude.

In the prior art, resistors and electrical fuses employing a doped semiconductor material are typically formed within a semiconductor substrate, i.e., below a top surface of a single crystalline semiconductor substrate, or at a gate level, i.e., at the same level as gate conductor lines. In the case of resistors and electrical fuses formed in the semiconductor substrate, dopants are introduced into portions of the semiconductor substrate to lower the resistivity of the semiconductor substrate sufficiently so that the doped semiconductor material has a reduced level of resistivity. In the case of resistors and electrical fuses formed at gate level, a doped polycrystalline semiconductor layer is formed directly on a gate dielectric layer by deposition of a doped semiconductor material or by deposition of an undoped semiconductor material. The doped semiconductor layer is lithographically patterned to form resistors and electrical fuses.

The doped semiconductor material has a higher resistivity than metallic materials, typically by at least two orders of magnitude. In the case of doped silicon, resistors and electrical fuses having a resistivity in the range from about $1.0 \times 10^{-4}$ Ohm-cm to about 1.0 Ohm-cm may be formed by employing in-situ doping and/or ion implantation.

Such prior art doped semiconductor material form resistive structures located in the semiconductor substrate or directly on a gate dielectric below the first line level metal wiring structures, i.e., the level of metal lines that are closest to the semiconductor substrate. For this reason, the prior art resistive structures formed in the substrate or directly on a gate dielectric are "front-end-of-line" (FEOL) semiconductor structures located below the level of the first line level metal wiring structures and formed prior to formation of the first line level metal wiring structures. Each such FEOL resistive structure occupies an area of a semiconductor substrate that no other FEOL semiconductor device may occupy. Thus, formation of a FEOL resistive structure according to the prior art reduces area for other semiconductor devices, thereby limiting device density for FEOL semiconductor devices.

Further, the height or depth of the prior art FEOL resistive devices is limited either by the thickness of the gate conductor layer and the energy distribution of ion implantation. In addition, the width of the prior art FEOL resistive devices are limited by lithographic constraints since lithographic patterning determines the width of the prior art FEOL resistive devices. Thus, formation of a relatively high resistance structure requires a large structure located in or directly on the semiconductor substrate.

In view of the above, there exists a need for a resistive structure that occupies as small space as possible in front-end-of-line (FEOL) device areas, i.e., the volume beneath a first level metal wiring structures, and design structures for the same.

Further, there exists a need for a resistive structure that may provide a high resistance value with a minimal device volume, and particularly a resistive structure that may have a sublithographic width, and design structures for the same.

BRIEF SUMMARY OF THE INVENTION

The present invention provides a semiconductor structure including a resistive structure comprising a doped semiconductor material and formed in back-end-of-line (BEOL), i.e., at or above a first line level metal wiring structure, and design structures for the same.

In one embodiment, a back-end-of-line (BEOL) resistive structure comprises a second metal line embedded in a second dielectric layer and at least partially overlying a first metal line embedded in a first dielectric layer. A doped semiconductor spacer or plug laterally abutting sidewalls of the second metal line and vertically abutting a top surface of the first metal line provides a resistive link between the first and second metal lines. To form the BEOL resistive structure, a portion of the second dielectric layer overlying the first metal line is recessed employing a photoresist and the second metal line as an etch mask. A doped semiconductor spacer is formed within the recess to provide a resistive link between the first metal line and the second metal line. A doped semiconductor plug may be formed instead of the doped semiconductor spacer. The resistive structure is located in a back-end-of-line structure, and therefore, does not occupy any space in front-end-of-line areas.

In another embodiment, another BEOL resistive structure comprises a first metal line and a second metal line are embedded in a dielectric layer. A doped semiconductor spacer or plug laterally abutting the sidewalls of the first and second metal lines provides a resistive link between the first and second metal lines. To form the BEOL resistive structure, an area of the dielectric layer laterally abutting the first and second metal lines is recessed employing a photoresist and the first and second metal lines as an etch mask. A doped semiconductor spacer is formed on sidewalls of the first and second metal lines, providing a resistive link between the first and second metal lines. The dielectric layer may be a layer in BEOL, in which case the resistive structure does not occupy any space in front-end-of-line (FEOL) areas.

According to an aspect of the present invention, a semiconductor structure is provided, which comprises:

a first interconnect level structure including a first dielectric layer and a first metal line embedded therein;

a second interconnect level structure vertically abutting the first interconnect level structure and including a second dielectric layer and at least one second metal line embedded therein; and a doped semiconductor structure laterally abutting the at least one second metal line and vertically abutting the first metal line.

In one embodiment, the doped semiconductor structure is a doped semiconductor spacer having a pair of substantially parallel sidewalls that directly adjoin the first metal line.

In another embodiment, the doped semiconductor spacer is topologically homeomorphic to a torus.

In even another embodiment, the semiconductor structure further comprises a third interconnect level structure vertically abutting the second interconnect level structure and including an upper portion of a third dielectric layer, wherein a lower portion of the third dielectric layer vertically abuts the first metal line.

In yet another embodiment, the semiconductor structure further comprises:

at least one additional metal line embedded in the second dielectric layer;

at least one interconnect via embedded in the second dielectric layer and vertically abutting the at least another second metal line; and at least another first metal line embedded in the first dielectric layer and vertically abutting the at least one interconnect via.

In still another embodiment, the second interconnect level structure is completely filled with the second dielectric layer, the at least one second metal line, the doped semiconductor spacer, the lower portion of the third dielectric layer, the at least one additional metal line, and the at least one interconnect via.

In a further embodiment, the doped semiconductor structure comprises a doped semiconductor plug having a top surface that is substantially coplanar with a top surface of the at least one second metal line.

In an even further embodiment, the semiconductor structure further comprises a third interconnect level structure vertically abutting the second interconnect level structure and including a third dielectric layer, wherein a top surface of the at least one second metal line, a top surface of the doped semiconductor plug, and a top surface of the second dielectric layer vertically abut a bottom surface of the third dielectric layer.

In a yet further embodiment, the semiconductor structure further comprises:

at least another second metal line embedded in the second dielectric layer;

at least one interconnect via embedded in the second dielectric layer and vertically abutting the at least another second metal line; and at least another first metal line embedded in the first dielectric layer and vertically abutting the at least one interconnect via.

In a still further embodiment, the second interconnect level structure is completely filled with the second dielectric layer, the at least one second metal line, the doped semiconductor plug, the at least another second metal line, and the at least one interconnect via.

In further another embodiment, the doped semiconductor structure is polycrystalline and comprises one of silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials.

In an even further another embodiment, the semiconductor structure further comprises:

a semiconductor substrate located underneath the first interconnect level structure; and at least one semiconductor device located directly on the semiconductor substrate and underneath the first interconnect level structure.

According to another aspect of the present invention, another semiconductor structure is provided, which comprises:

an interconnect level structure including a dielectric layer and first and second metal lines embedded therein; and a doped semiconductor structure laterally abutting the first metal line and the second metal line.

In one embodiment, the doped semiconductor structure is a doped semiconductor spacer that is topologically homeomorphic to a torus.

In another embodiment, the semiconductor structure further comprises another interconnect level structure vertically abutting the interconnect level structure and including an upper portion of a another dielectric layer, wherein a lower portion of the other dielectric layer laterally abuts the doped semiconductor spacer.

In even another embodiment, the semiconductor structure further comprises:

at least one additional metal line embedded in the dielectric layer; and at least one interconnect via embedded in the second dielectric layer and vertically abutting the at least another second metal line.

In yet another embodiment, the interconnect level structure is completely filled with the dielectric layer, the first metal line, the second metal line, the doped semiconductor spacer, the lower portion of the other dielectric layer, the at least one additional metal line, and the at least one interconnect via.

In still another embodiment, the doped semiconductor structure comprises a doped semiconductor plug having a top surface that is substantially coplanar with a top surface of the first metal line and the second metal line.

In a further embodiment, the semiconductor structure further comprises:

a semiconductor substrate located underneath the first interconnect level structure; and at least one semiconductor device located directly on the semiconductor substrate and underneath the first interconnect level structure.

According to yet another aspect of the present invention, a design structure embodied in a machine readable medium for designing, manufacturing, or testing a design for a semiconductor structure is provided. The design structure comprises:

a first data representing a first interconnect level structure and including a second data representing a first dielectric layer and a third data representing a first metal line embedded in the first dielectric layer;

a fourth data representing a second interconnect level structure vertically abutting the first interconnect level structure and including a fifth data representing a second dielectric layer and a sixth data representing at least one second metal line embedded in the second dielectric layer; and a seventh data representing a doped semiconductor structure laterally abutting the at least one second metal line and vertically abutting the first metal line.

In one embodiment, the seventh data represents a doped semiconductor spacer having a pair of substantially parallel sidewalls that directly adjoin the first metal line.

In another embodiment, the design structure further comprises:

an eighth data representing at least one additional metal line embedded in the second dielectric layer;

a ninth data representing at least one interconnect via embedded in the second dielectric layer and vertically abutting the at least another second metal line; and a tenth data representing at least another first metal line embedded in the first dielectric layer and vertically abutting the at least one interconnect via.

In even another embodiment, the seventh data represents a doped semiconductor plug having a top surface that is substantially coplanar with a top surface of the at least one second metal line.

In yet another embodiment, the design structure further comprises an additional data representing a semiconductor substrate located underneath the interconnect level structure; and another additional data representing at least one semiconductor device located directly on the semiconductor substrate and underneath the first interconnect level structure.

According to still another aspect of the present invention, another design structure embodied in a machine readable medium for designing, manufacturing, or testing a design for a semiconductor structure is provided. The design structure comprises:

a first data representing an interconnect level structure and including a second data representing a dielectric layer, a third data representing a first metal line embedded in the dielectric layer, and a fourth data representing a second metal lines embedded in the dielectric layer; and a fifth data representing a doped semiconductor structure laterally abutting the first metal line and the second metal line.

In one embodiment, the fifth data represents a doped semiconductor spacer that is topologically homeomorphic to a torus or a doped semiconductor plug having a top surface that is substantially coplanar with a top surface of the first metal line and the second metal line.

In another embodiment, the design structure further comprises:

an additional data representing at least one additional metal line embedded in the dielectric layer; and another additional data representing at least one interconnect via embedded in the second dielectric layer and vertically abutting the at least another second metal line.

In yet another embodiment, the fifth data represents a doped semiconductor plug having a top surface that is substantially coplanar with a top surface of the first metal line and the second metal line.

In still another embodiment, the design structure further comprising a sixth data representing a semiconductor substrate located underneath the interconnect level structure; and a seventh data representing at least one semiconductor device located directly on the semiconductor substrate and underneath the first interconnect level structure.

BRIEF DESCRIPTION OF THE SEVERAL VIEWS OF THE DRAWINGS

In all of the drawings herein, figures with the same numeric label and different alphabetical suffixes correspond to the same stage of a manufacturing process. Figures with the suffix "A" are top-down views. Figures with the suffix "B" or "C" are vertical cross-sectional views along the plane B-B' or C-C', respectively, of the corresponding figure with the same numeric label and the suffix "A."

FIGS. 1A-1C, 2A-2C, 3A-3C, 4A-4C, and 5A-5C are sequential views of a first exemplary back-end-of-line (BEOL) semiconductor structure according to a first embodiment of the present invention.

FIGS. 1A-1C correspond to a step after formation of a first interconnect level structure 11 and a second interconnect level structure 31. FIGS. 2A-2C correspond to a step after formation of a cavity 69 in the second interconnect level structure 31. FIGS. 3A-3C correspond to a step after formation of a semiconductor layer 50L on the second interconnect level structure 31. FIGS. 4A-4C correspond to a step after formation of a doped semiconductor spacer 50. FIGS. 5A-5C correspond to a step after formation of a third interconnect level structure 71.

FIGS. 6A, 6B, and 6C is a variant of the first exemplary BEOL semiconductor structure in which the doped semiconductor spacer 50 is recessed from a top surface of the second interconnect level structure 31 and has a rounded top surface.

FIGS. 8A-8C correspond to a step after formation of a semiconductor layer 50L on the second interconnect level structure 31. FIGS. 9A-9C correspond to a step after formation of a doped semiconductor plug 52. FIGS. 10A-10C correspond to a step after formation of a third interconnect level structure 71.

FIGS. 12A-12C, 13A-13C, 14A-14C, 15A-15C, and 16A-16C are sequential views of a third exemplary BEOL semiconductor structure according to a third embodiment of the present invention.

FIGS. 12A-12C correspond to a step after formation of an underlying interconnect level structure 111 and an interconnect level structure 131. FIGS. 13A-13C correspond to a step after formation of a cavity 169 in the interconnect level structure 131. FIGS. 14A-14C correspond to a step after formation of a semiconductor layer 150L on the interconnect level structure 131. FIGS. 15A-15C correspond to a step after formation of a doped semiconductor spacer 150. FIGS. 16A-16C correspond to a step after formation of an overlying interconnect level structure 171.

FIGS. 18A-18C and 19A-19C are sequential views of a fourth exemplary BEOL semiconductor structure according to a fourth embodiment of the present invention.

FIGS. 18A-18C correspond to a step after formation of a doped semiconductor spacer 150 that contacts the underlying interconnect level structure 111. FIGS. 19A-19C correspond to a step after formation of an overlying interconnect level structure 171 that directly contacts the underlying interconnect level structure 111 by filling a cavity 169.

DETAILED DESCRIPTION OF THE INVENTION

Figure 1A:
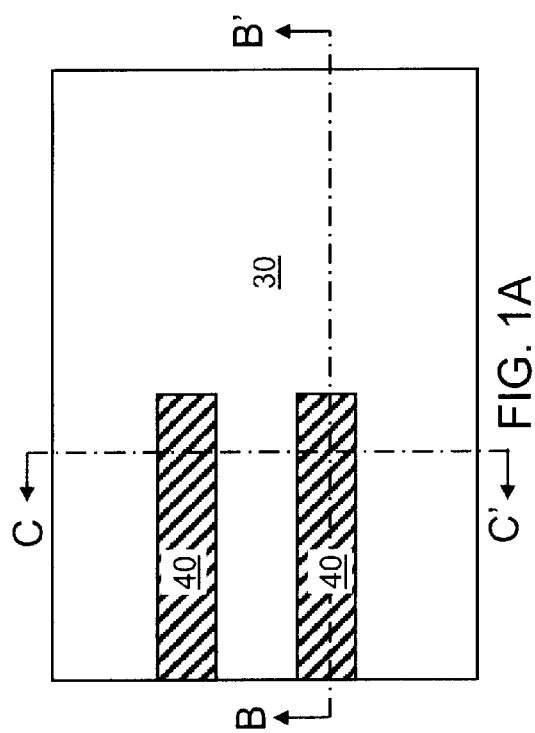

As stated above, the present invention relates to a back-end-of-line (BEOL) resistive structure comprising a doped semiconductor material, and design structures for the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element.

Figure 1B:
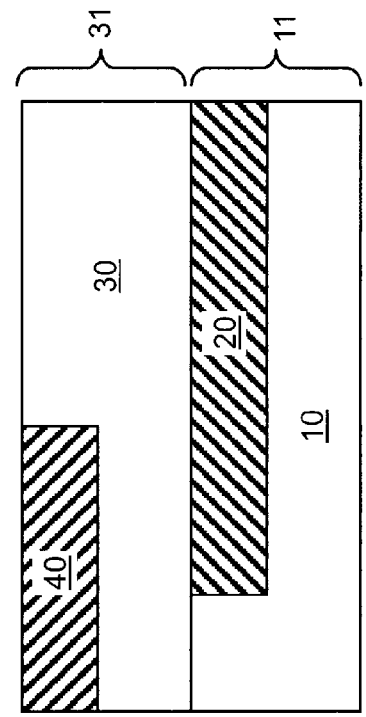
Figure 1C:
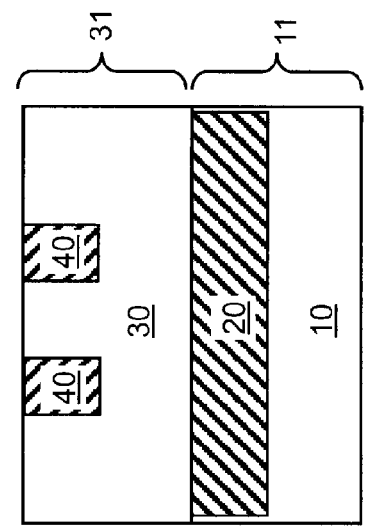

Referring to FIG. 1, a first exemplary back-end-of-line (BEOL) semiconductor structure according to a first embodiment of the present invention comprises a vertical stack of a first interconnect level structure 11 and a second interconnect level structure 31. The first interconnect level structure 11 comprises a first dielectric layer 10 and a first metal line 20 embedded therein. The second interconnect level structure 31 comprises a second dielectric layer 30 and at least one second metal line 40 embedded therein.

The first interconnect level structure 11 may be formed on a substrate (not shown) such as a semiconductor substrate. As such, the first interconnect level structure 11 and the second interconnect level structure 31 may be a back-end-of-line (BEOL) metal interconnect structure that provides electrical wiring of semiconductor devices that are formed in, or directly on, the semiconductor substrate and known in the art as front-end-of-line (FEOL) semiconductor devices. The FEOL semiconductor devices are located below the level of first line level metal wiring structures, which are the line level metal wiring structures located closest to the semiconductor substrate among the line level metal wiring structures on the structure. The first line level is typically referred to as an "M1" level. As BEOL metal interconnect structures, the first interconnect level structure 11 is located at, or above, the level of the first line level metal wiring structures. The second interconnect level structure 31 is located above the level of the first line level metal wiring structures.

The first dielectric layer 10 and the second dielectric layer 30 comprise a dielectric material that are employed in BEOL interconnect structures. The dielectric materials that may be used for the first dielectric layer 10 and/or the second dielectric layer 30 include, but are not limited to, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may non-porous or porous.

The dielectric material of the first dielectric layer 10 and the second dielectric layer 30 may be formed by plasma enhanced chemical vapor deposition, high density plasma chemical vapor deposition, thermal chemical vapor deposition, spin coat and cure, etc. The thickness of each of the first dielectric layer 10 and the second dielectric layer 30 may be from about 100 nm to about 2,000 nm, and typically from about 200 nm to about 1,000 nm, although lesser and greater thicknesses are also contemplated herein.

The first metal line 20 and the at least one second metal line 40 are formed by etching line trenches in the first dielectric layer 10 and the second dielectric layer 30, respectively, and subsequently filling the line trenches with metal. The metal may be deposited into the line trenches, for example, by physical vapor deposition (sputtering), electroplating, electroless plating, chemical vapor deposition, or a combination thereof. Any portion of the metal overlying the top surfaces of the first dielectric layer 10 or the second dielectric layer 30 is removed, for example, by chemical mechanical polishing (CMP), recess etch, or a combination thereof. Additional metal lines (not shown) may be formed at the same level as the first metal line 20 and/or the at least one second metal line 40 to provide horizontal electrical wiring within the same line level. Additional conductive vias (not shown) may be formed underneath the first metal line 20 and/or the at least one second metal line 40 to provide vertical electrical connection between metal lines located at different levels. The thickness of each of the first metal line 20 and the at least one second metal line 40 may be from about 50 nm to about 1,000 nm, and typically from about 100 nm to about 500 nm, although lesser and greater thicknesses are also contemplated herein.

The at least one second metal line 40 at least partially overlie the first metal line 20. In other words, at least a portion of the area of the at least one second metal line 40 as seen in a top-down view such as the view of FIG. 1A overlaps at least a portion of the area of the first metal line 20 as seen in a see-through top-down view.

Referring to FIGS. 2A-2C, a photoresist 47 is applied over the top surface of the second interconnect level structure 31, and is lithographically patterned to form an opening in the photoresist 47. A lateral boundary between the at least one second metal line 40 and the second dielectric layer 30 at the top surface of the second interconnect level structure 31 is exposed within the area of the opening in the photoresist 47. The area of the opening includes a top surface of the at least one second metal line 40 and a top surface of the second dielectric layer 30 around the lateral boundary. Preferably, the exposed area of the at least one second metal line 40 within the opening overlies the first metal line 20.

Employing the photoresist 47 and the at least one second metal line 40 as an etch mask, an etch is performed to recess the second dielectric layer 30 within the opening of the photoresist 47. The etch may be an anisotropic etch such as a reactive ion etch or an isotropic etch such as a wet etch. The expose portion of the second dielectric layer 30 is etched within the opening in the photoresist 47 selective to the at least one second metal line 40. A cavity 69 having an opening at the level of the top surface of the second interconnect level structure 31 is formed in the volume of the removed portion of the second dielectric layer 30 within the second interconnect level structure 31. Sidewalls of the at least one second metal line 40, sidewalls of the second dielectric layer 30, and a top surface of the first metal line 20 are exposed after the etch within the cavity 69.

In case the etch is an anisotropic etch, the sidewalls of the cavity 69 are substantially vertical, and may be substantially vertically coincident with the exposed sidewalls of the at least one second metal line 40 and the edges of the opening in the photoresist 47. Since the exposed portion of the at least one second metal line 40 within the opening protects the material of the second dielectric layer 30 directly underneath from the anisotropic etch, at least one portion of the second dielectric layer 30 which underlies a portion of the at least one second metal line 40 within the opening is formed after the first metal line 20 is exposed in the cavity 69. The cavity 69 extends from the top surface of the second interconnect level structure 31 to the bottom surface of the second interconnect level structure 31, which coincides with the top surface of the first interconnect level structure 11.

The photoresist 47 is subsequently removed. The exposed surfaces of the at least one second metal line 40, the first metal line 20, and the second dielectric layer 30 may be cleaned to remove residual polymers from the etch, if any.

Referring to FIGS. 3A-3C, a semiconductor layer 50L is formed on the exposed surfaces of the first exemplary BEOL semiconductor structure including the top surface and sidewalls of the at least one second metal line 40, the exposed top surface of the first metal line 20, and the dielectric portions of the sidewalls of the trench 69, which comprises exposed substantially vertical surfaces of the second dielectric layer 30. The semiconductor layer 50L comprises a semiconductor material, and may be deposited as an amorphous material or a polycrystalline material. In case the semiconductor layer 50L is deposited as an amorphous material, a suitable anneal at an elevated temperature may be performed to convert the amorphous material into a polycrystalline material to adjust the resistivity of the semiconductor material to a desirable value.

Non-limiting examples of semiconductor materials that may be employed for the semiconductor layer 50L include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. A common semiconductor material for the semiconductor layer 50L is polysilicon, i.e., silicon in polycrystalline form. The semiconductor layer 50L may be formed by plasma enhanced chemical vapor deposition (PECVD), physical vapor deposition (PVD), thermal chemical vapor deposition, etc. The semiconductor layer 50L may be conformal or non-conformal.

The semiconductor layer 50L is doped with electrical dopants, i.e., dopants that provide charge carriers in the semiconductor layer 50L to increase the conductivity of the semiconductor layer 50L above the level of conductivity of an intrinsic semiconductor material, which is typically too low and difficult to control for resistive structures with a controlled resistance. For example, the semiconductor layer 50L may comprise doped polysilicon, a doped silicon-containing alloy, a doped germanium-containing alloy, a doped compound semiconductor material, etc. The electrical dopants may be p-type dopants such as B, Ga, and/or In, or n-type dopants such as P, As, and/or Sb. The dopants may be introduced into the semiconductor layer 50L by in-situ doping, i.e., incorporation of dopants from a gas stream into the deposited semiconductor material of the semiconductor layer 50L while the deposition is in progress in a reactor, or may be introduced into the semiconductor layer 50L by ion implantation. In case the semiconductor layer 50L comprises silicon, a resistivity range from about $1.0 \times 10^{-4}$ Ohm-cm to about 1.0 Ohm-cm may be achieved by ion implantation, although higher resistivity ranges are also contemplated herein. The dopant concentration in the semiconductor layer 50L may be optimized for the desired resistance value of a doped semiconductor structure to be subsequently formed from a portion of the semiconductor layer 50L.

The thickness of the semiconductor layer 50L is set such that the cavity 69 is not completely filled with the semiconductor layer 50L. The thickness of the semiconductor layer 50L may be from about 15 nm to about 500 nm, and typically from about 30 nm to about 150 nm, although lesser and greater thicknesses are also contemplated herein. The thickness of the semiconductor layer 50L may also be optimized for the desired resistance value of the doped semiconductor structure to be subsequently formed.

Referring to FIGS. 4A-4C, an anisotropic etch such as a reactive ion etch (RIE) is employed to form a doped semiconductor spacer 50. The anisotropic etch removes horizontal portions of the semiconductor layer 50L including the portion of the semiconductor layer 50L above the second interconnect level structure 31 and the horizontal portion of the semiconductor layer 50L directly on the top surface of the first metal line 20. A remaining vertical portion of the semiconductor layer 50L located directly on the sidewalls of the at least one second metal line 40 and the sidewalls of the second dielectric layer 30 constitutes the doped semiconductor spacer 50.

The doped semiconductor spacer 50 is a doped semiconductor structure comprising a doped semiconductor material. The doped semiconductor spacer 50 comprises a doped polycrystalline semiconductor material of the semiconductor layer 50L. The doped semiconductor spacer 50 laterally surrounds the cavity 69. A top surface of the first metal line 20 is exposed underneath the cavity 69. The doped semiconductor spacer 50 laterally abuts the sidewalls of the at least one second metal line 40 and vertically abuts the top surface of the first metal line 20. The doped semiconductor spacer 50 has at least one pair of substantially parallel sidewalls that directly adjoin the first metal line 20.

Since the doped semiconductor spacer 50L is formed on the sidewalls of the at least one second metal line 40 and the second dielectric layer 30 that surround the cavity 69, the doped semiconductor spacer 50 may be ring-shaped, or "topologically homeomorphic to a torus." Homeomorphism in topology refers to a continuous stretching and bending of the object into a new shape. Continuous stretching involves a transformation without formation of any mathematical singularity, i.e., without removing any existing hole or forming a new hole in the shape. A torus has one topological handle, or a topological object of "genus 1." The doped semiconductor spacer 50L laterally surrounds the cavity 69, but does not fill the cavity 69, and has no twisted features. Therefore, the doped semiconductor spacer 50L may be continuously transformed into a torus by stretching and bending, and is therefore topologically homeomorphic to a torus.

Referring to FIGS. 5A-5C, a third dielectric layer 70 is deposited over the top surface of the second interconnect level structure 31 and inside the cavity 69. The third dielectric layer 70 may comprise any of the dielectric material listed above for the first and second dielectric layers (10, 30). The same deposition method may be employed to form the third dielectric layer 70 as the first and second dielectric layers (10, 30). A lower portion of the third dielectric layer 70, which is the portion of the third dielectric layer 70 located beneath the top surface of the at least one second metal line 40 and top surface of the second dielectric layer 30, vertically abuts the top surface of the first metal line 20 and laterally abuts the doped semiconductor spacer 50. In other words, the doped semiconductor spacer 50 laterally abuts and laterally surrounds the lower portion of the third dielectric layer 70.

The upper portion of the third dielectric layer 70, which is located above the top surface of the at least one second metal line 40 and top surface of the second dielectric layer 30, is formed in the same deposition step as the lower portion of the third dielectric layer 70. The upper portion of the third dielectric layer 70 and the lower portion of the third dielectric layer 70 comprise the same dielectric material and are of integral construction without any physically manifested interface therebetween.

At least one third metal line 80 and at least one conductive via (not shown) may be formed in the upper portion of the third dielectric layer 70. The upper portion of the third dielectric layer 70 above the top surface of the second interconnect level structure 31, the at least one third metal line 80, and the at least one conductive via embedded in the upper portion of the third dielectric layer 70 collectively constitute a third interconnect level structure 71. The third interconnect level structure 71 is located directly on, and above the top surface of, the second interconnect level structure 31.

Referring to FIGS. 6A, 6B, and 6C, a variant of the first exemplary BEOL semiconductor structure is shown, in which the doped semiconductor spacer 50 is recessed from the top surface of the second interconnect level structure 31 and has a rounded top surface. In general, the top surface of the doped semiconductor spacer may have a flat top surface or a rounded top surface, and the topmost portion of the doped semiconductor spacer may be substantially coplanar with the top surface of the second interconnect level structure 31 or may be located between the top surface of the at least one second metal line 40 and the bottom surface of the at least one second metal line 40. The topmost portion of the doped semiconductor spacer 50 is located above the bottom surface of the at least one second metal line 40 so that the doped semiconductor spacer 50 laterally abuts the sidewall(s) of the at least one second metal line 40.

Figure 7:
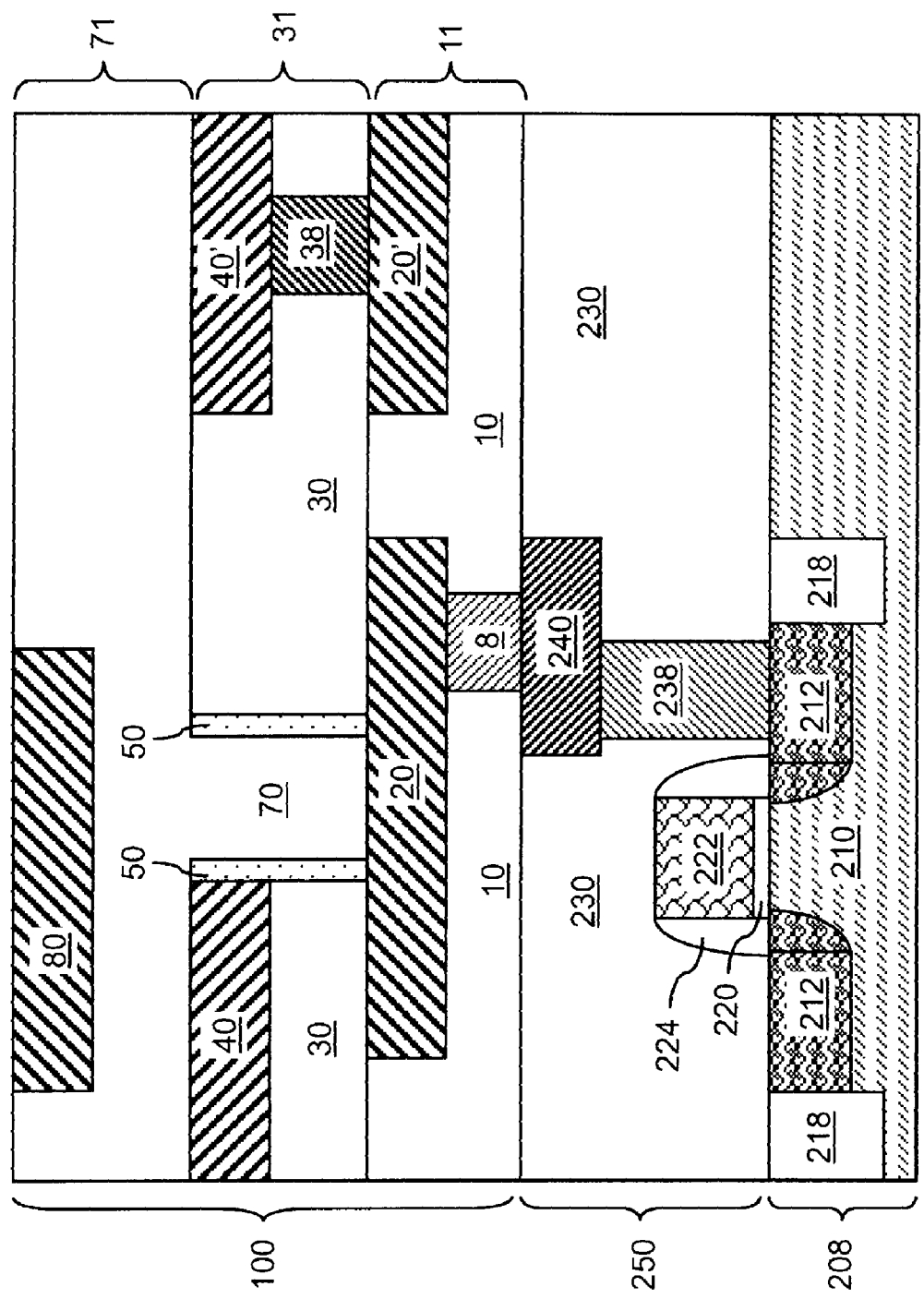
FIG. 7 is a vertical cross-sectional view of a first exemplary semiconductor structure incorporating the first exemplary BEOL semiconductor structure.

Referring to FIG. 7, a first exemplary semiconductor structure according to the first embodiment of the present invention is shown, which incorporates the first exemplary BEOL semiconductor structure 100. The first exemplary semiconductor structure includes the first exemplary BEOL semiconductor structure 100 of FIGS. 5A-5C, at least another first metal line 20' embedded in the first dielectric layer 10, at least one interconnect via 38 embedded in the second dielectric layer 30 and vertically abutting the at least another first metal line 20', and at least one additional metal line 40' embedded in the second dielectric layer 30. The at least another first metal line 20' is located at the same level as the first metal line 20 within the first interconnect level structure 11, and vertically abuts the second interconnect level structure 21. The at least one additional metal line 40' is located at the same level as the at least one second metal line 40, and vertically abuts the third interconnect level structure 71. The first interconnect level structure 11 may include at least another interconnect via 8 that electrically connects the first metal line 20 to a conductive structure or device underneath.

In one case, the second interconnect level structure 31 may be completely filled with the second dielectric layer 30, the at least one second metal line 40, the doped semiconductor spacer 50, the lower portion of the third dielectric layer 70, the at least one additional metal line 40', and the at least one interconnect via 38.

The first exemplary semiconductor structure further comprises a semiconductor substrate 208 and a first BEOL level structure 250 located underneath the first exemplary BEOL semiconductor structure 100. The first BEOL level structure 250 includes first line level metal wiring structures such as at least one first-level metal line 240. In one case, the first exemplary BEOL semiconductor structure 100 may vertically abut the first BEOL level structure 250. In another case, at least one intervening interconnect level structure (not shown) may be formed between the first exemplary BEOL semiconductor structure 100 and the first BEOL level structure 250. In yet another case, the first interconnect level structure 11 may be at the same level as, and overlap with, the first BEOL level structure 250. In other words, the first metal line 20 may be one of the first line level metal wiring structures and located at the same level as the at least one first-level metal line 240, and the first interconnect level structure 11 and the first BEOL level structure 250 are one and the same.

The semiconductor substrate 208 comprises a semiconductor layer 210 and at least one semiconductor device formed in the semiconductor substrate 208 or directly on the semiconductor substrate 208. For example, the semiconductor substrate 208 may include at least one shallow trench isolation structure 218 that provides electrical isolation between adjacent semiconductor devices. The at least one semiconductor device may include, for example, a field effect transistor having a gate dielectric 220, a gate electrode 222, and a gate spacer formed on the surface of the semiconductor layer 210 and source and drain regions 212 formed within the semiconductor substrate 208. The at least one semiconductor device may be electrically connected to the metal interconnect structures above through at least one contact level via 238 and the at least one first-level metal line 240, which are embedded in a first BEOL level dielectric layer 230 that vertically abut the semiconductor substrate 208.

The doped semiconductor spacer 50 functions as a resistive link for a resistor or an electrical fuse. If the doped semiconductor spacer 50 is employed for a resistor, the current density through the doped semiconductor spacer 50 is maintained below a predetermined level to prevent change in resistance due to structural changes. If the doped semiconductor spacer 50 is employed for an electrical fuse, the doped semiconductor spacer may be "programmed" to change the resistance, typically by increasing the resistance, by passing enough current to cause structural changes and accompanying increase in resistance. Since the doped semiconductor spacer 50 is formed within an interconnect level structure, and not in the semiconductor substrate 208 or on the surface of the semiconductor layer 210, the doped semiconductor spacer 50 is not a FEOL device and does not occupy any volume in or directly on the semiconductor substrate 208. Thus, more other FEOL devices may be formed on the semiconductor substrate 208 by forming the doped semiconductor structure 50 as a resistive device element in the BEOL, thereby enabling higher density semiconductor structures.

Figure 8A:
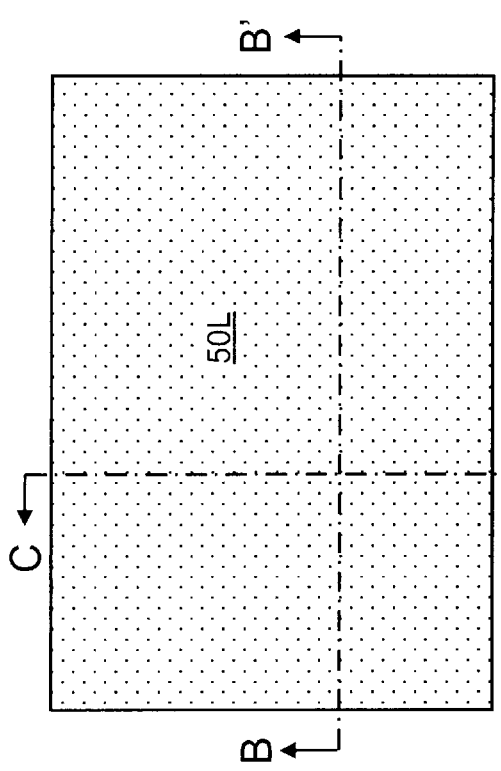
FIGS. 8A-8C, 9A-9C, and 10A-10C are sequential views of a second exemplary BEOL semiconductor structure according to a second embodiment of the present invention.
Figure 8B:
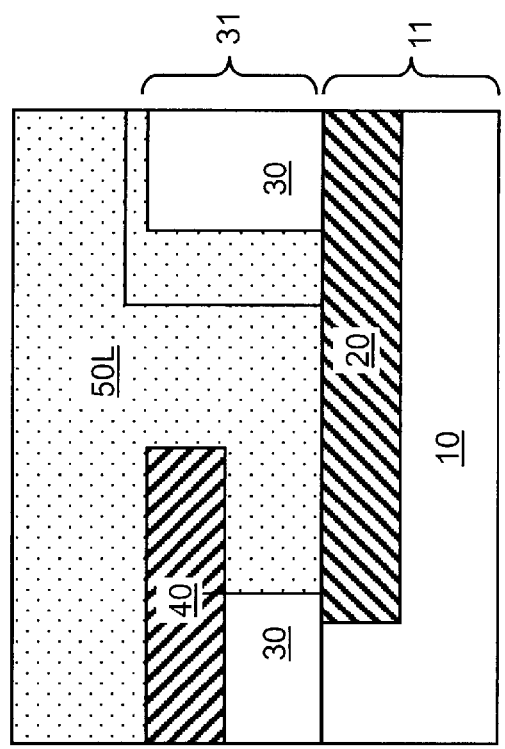
Figure 8C:
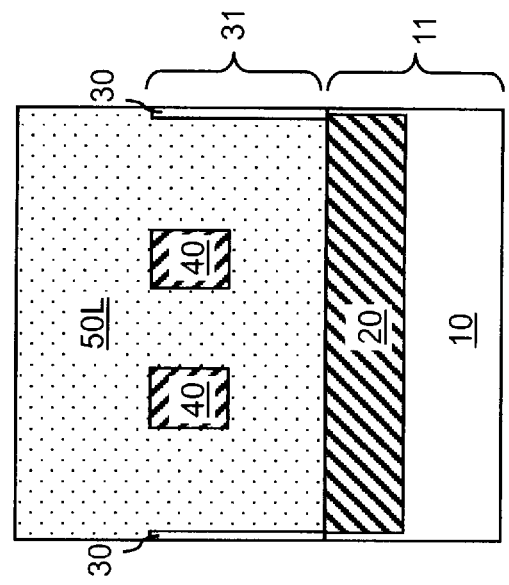

Referring to FIGS. 8A-8C, a second exemplary BEOL semiconductor structure according to a second embodiment of the present invention is derived from the first exemplary BEOL semiconductor structure of FIGS. 2A-2C. After forming the structure shown in FIGS. 2A-2C and prior to removing the photoresist 47, a substantially isotropic etch is performed to substantially isotropically remove the material of the second dielectric layer 30 employing the photoresist 47 and the at least one second metal line as an etch mask. The substantially isotropic etch is selective to the at least one second metal line 40 and the first metal line 20. At least one portion of the second dielectric layer 30 located directly underneath the exposed portion(s) of the at least one second metal line 40 is removed during the substantially isotropic etch. The cavity 69 in FIGS. 2A-2C is thereby laterally expanded.

After removing the photoresist 47 (See FIGS. 2A-2C), a semiconductor layer 50L is formed on the exposed surfaces of the second exemplary BEOL semiconductor structure including the top surface and sidewalls of the at least one second metal line 40, the exposed top surface of the first metal line 20, and the dielectric portions of the sidewalls of the trench 69, which comprises exposed substantially vertical surfaces of the second dielectric layer 30. Since at least a portion of the second dielectric layer 30 is removed during the substantially isotropic etch, at least one portion of the at least one second metal line laterally protrudes over a substantially vertical sidewall of the second dielectric layer 30. Thus, the semiconductor layer 50L wraps around the at least one laterally protruding portion of the at least one second metal line as illustrated in FIG. 8C. The semiconductor layer 50L may comprise the same material as in the first embodiment. Particularly, the semiconductor layer 50L is doped with electrical dopants to provide the same level of resistivity as in the first embodiment.

The thickness of the semiconductor layer 50L is set such that the cavity 69 is completely filled with the semiconductor layer 50L. The thickness of the semiconductor layer 50L may be from about 50 nm to about 2,000 nm, and typically from about 100 nm to about 1,000 nm, although lesser and greater thicknesses are also contemplated herein.

Figure 9A:
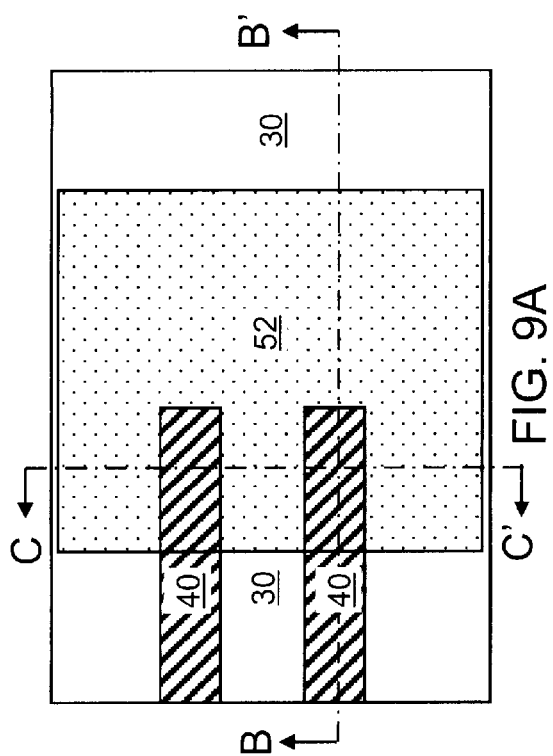
Figure 9B:
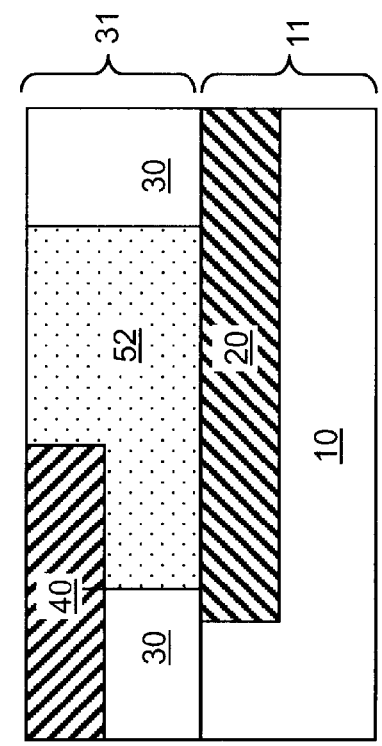
Figure 9C:
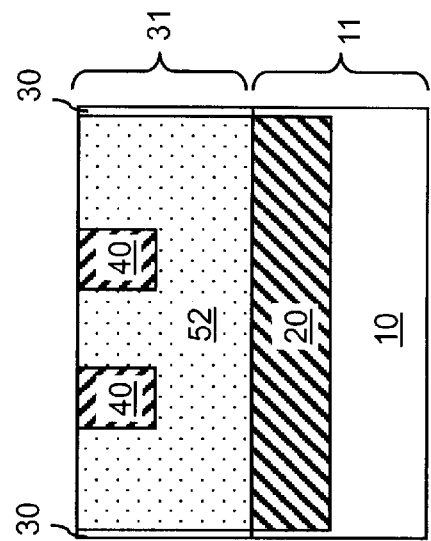

Referring to FIGS. 9A-9C, the semiconductor layer 50L is planarized to the level of the top surface of the second interconnect level structure 31, i.e., the top surface of the at least one second metal line 40 and the second dielectric layer 30. Chemical mechanical planarization (CMP), a recess etch, or a combination thereof may be employed to remove the excess material of the semiconductor layer 50L from above the top surface of the second interconnect level structure 31. The remaining vertical portion of the semiconductor layer 50L located beneath the top surface of the second interconnect level structure 31 constitutes a doped semiconductor plug 52.

The doped semiconductor plug 52 is a doped semiconductor structure comprising a doped semiconductor material. The doped semiconductor plug 52 comprises a doped polycrystalline semiconductor material of the semiconductor layer 50L. The doped semiconductor plug 52 completely fills the cavity 69 (See FIGS. 2A-2C). The doped semiconductor plug 52 laterally abuts the sidewalls of the at least one second metal line 40 and the sidewalls of the second dielectric layer 30. The doped semiconductor plug 52 vertically abuts the top surface of the first metal line 20. The doped semiconductor plug 52 has a top surface that is substantially coplanar with the top surface of the second interconnect level structure 31.

Figure 10A:
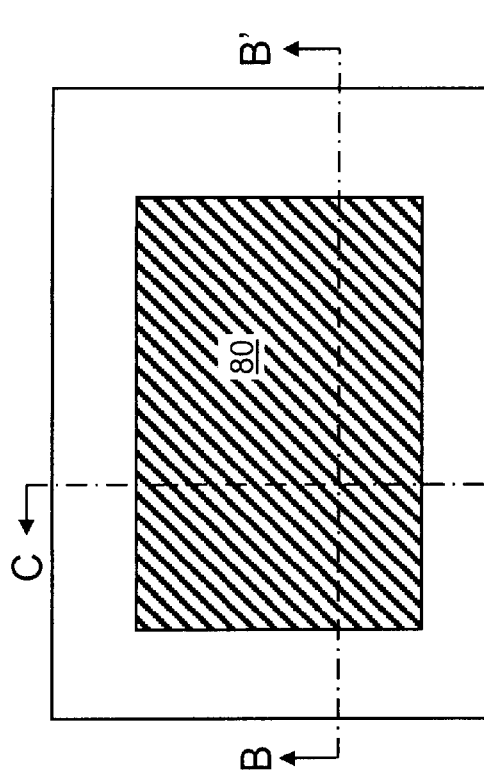
Figure 10B:
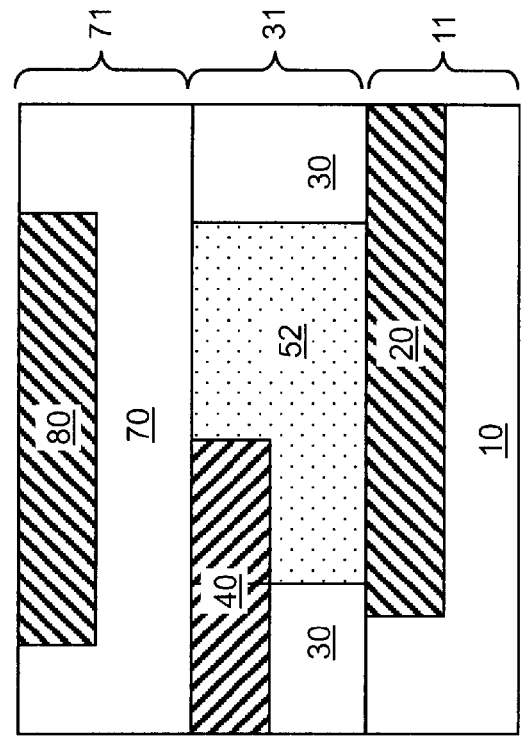
Figure 10C:
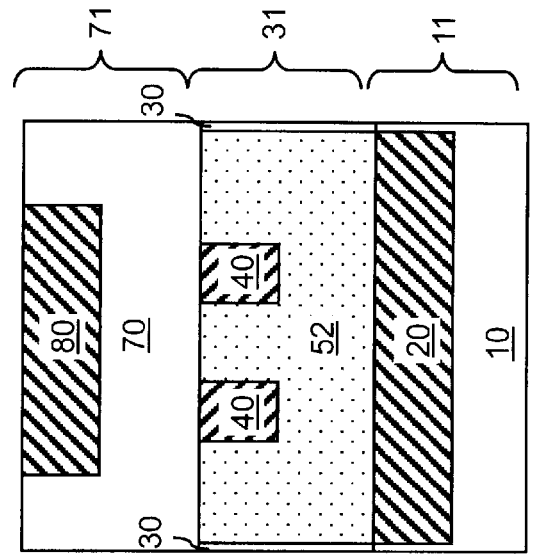

Referring to FIGS. 10A-10C, a third dielectric layer 70 is deposited over the top surface of the second interconnect level structure 31. The third dielectric layer 70 may comprise any of the dielectric material listed above for the first and second dielectric layers (10, 30). The same deposition method may be employed to form the third dielectric layer 70 as the first and second dielectric layers (10, 30). The third dielectric layer 70 is formed over and directly on the top surfaces of the at least one second metal line 40, the doped semiconductor plug 52, and the second dielectric layer 30.

At least one third metal line 80 and at least one conductive via (not shown) may be formed in the third dielectric layer 70. The third dielectric layer 70 above the top surface of the second interconnect level structure 31, the at least one third metal line 80, and the at least one conductive via embedded in the upper portion of the third dielectric layer 70 collectively constitute a third interconnect level structure 71. The third interconnect level structure 71 is located directly on, and above the top surface of, the second interconnect level structure 31.

Figure 11:
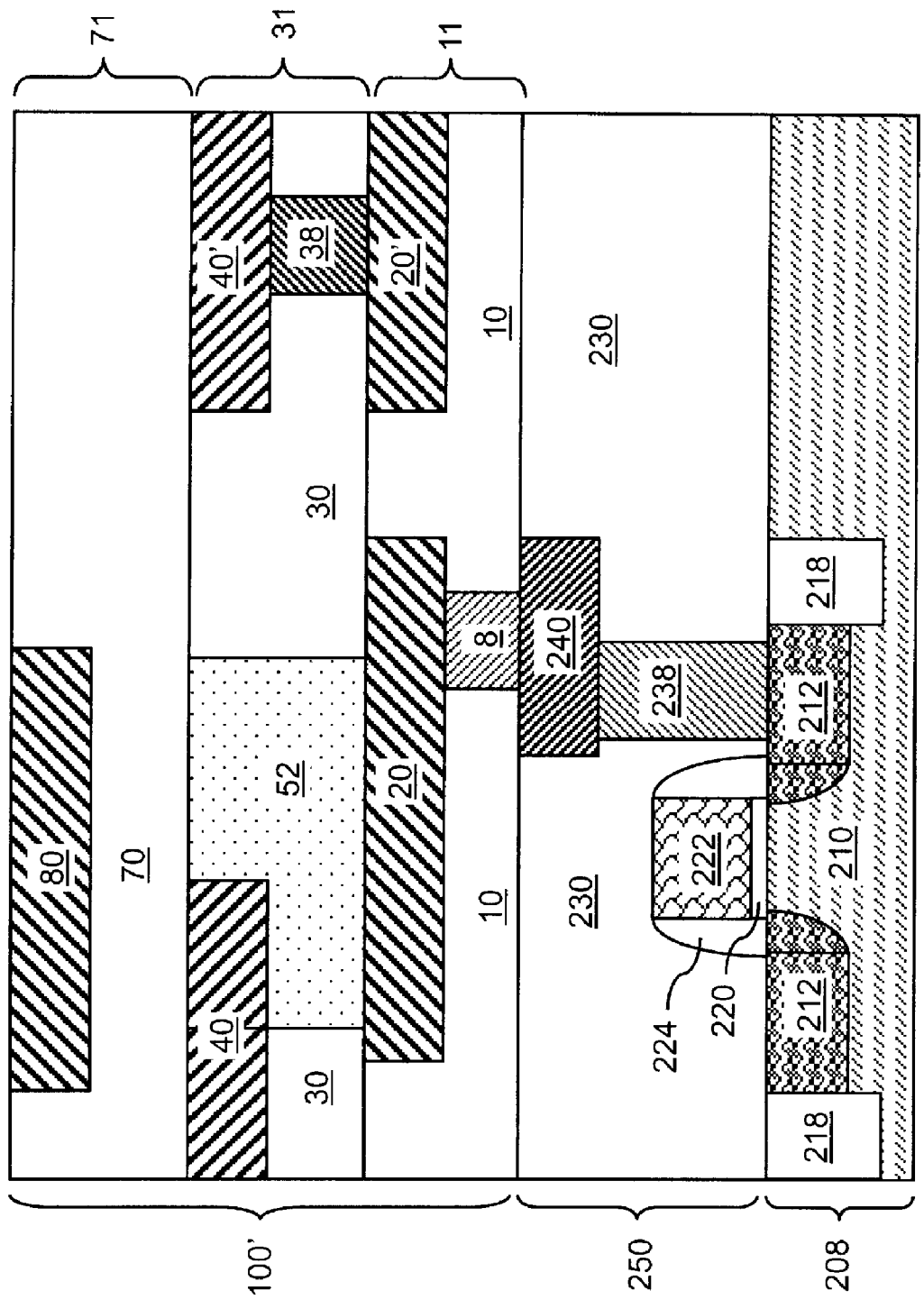
FIG. 11 is a vertical cross-sectional view of a second exemplary semiconductor structure incorporating the second exemplary BEOL semiconductor structure.

Referring to FIG. 11, a second exemplary semiconductor structure is shown, which incorporates the second exemplary BEOL semiconductor structure 100. The second exemplary semiconductor structure includes the second exemplary BEOL semiconductor structure 100' of FIGS. 10A-10C, at least another first metal line 20' embedded in the first dielectric layer 10, at least one interconnect via 38 embedded in the second dielectric layer 30 and vertically abutting the at least another first metal line 20', and at least one additional metal line 40' embedded in the second dielectric layer 30. The at least another first metal line 20' is located at the same level as the first metal line 20 within the first interconnect level structure 11, and vertically abuts the second interconnect level structure 21. The at least one additional metal line 40' is located at the same level as the at least one second metal line 40, and vertically abuts the third interconnect level structure 71. The first interconnect level structure 11 may include at least another interconnect via 8 that electrically connects the first metal line 20 to a conductive structure or device underneath.

In one case, the second interconnect level structure 31 may be completely filled with the second dielectric layer 30, the at least one second metal line 40, the doped semiconductor plug 52, the at least one additional metal line 40', and the at least one interconnect via 38.

The second exemplary semiconductor structure further comprises a semiconductor substrate 208 and a first BEOL level structure 250 located underneath the second exemplary BEOL semiconductor structure 100'. The doped semiconductor plug 52 functions as a resistive link for a resistor or an electrical fuse in the same manner as in the first embodiment of the present invention. Since the doped semiconductor plug 52 is formed within an interconnect level structure in BEOL, the doped semiconductor plug 52 does not occupy any space in or directly on the semiconductor substrate 208, thereby enabling formation of additional semiconductor devices directly on the semiconductor substrate 208.

Referring to FIGS. 12A-12C, a third exemplary BEOL semiconductor structure according to a third embodiment of the present invention comprises a vertical stack of an underlying interconnect level structure 111 and an interconnect level structure 131. The underlying interconnect level structure 111 comprises an underlying dielectric layer 110. At least one underlying metal line (not shown) may be embedded in the underlying dielectric layer 110. The interconnect level structure 131 comprises a dielectric layer 130 and a first metal line 142 and a second metal line embedded therein.

The underlying interconnect level structure 111 may be formed on a substrate (not shown) such as a semiconductor substrate. As such, the underlying interconnect level structure 111 and the interconnect level structure 131 may be a back-end-of-line (BEOL) metal interconnect structure that provides electrical wiring of semiconductor devices that are formed in or directly on the semiconductor substrate and known in the art as front-end-of-line (FEOL) semiconductor devices. The FEOL semiconductor devices are located below the level of first line level metal wiring structures, which are the line level metal wiring structures located closest to the semiconductor substrate among the line level metal wiring structures on the structure. As BEOL metal interconnect structures, the underlying interconnect level structure 111 is located at or above the level of the first line level metal wiring structures. The interconnect level structure 131 is located above the level of the first line level metal wiring structures.

The underlying dielectric layer 110 and the dielectric layer 130 comprises a dielectric material that are employed in BEOL interconnect structures. The underlying dielectric layer 110 and the dielectric layer 130 may have the same composition and thickness as, and may be formed employing the same methods as, the first, second, and third dielectric layers (10, 30, 70) in the first and second embodiment of the present invention described above.

A first metal line 142 and a second metal line 144 are formed by etching line trenches in the dielectric layer 130 and subsequently filling the line trenches with metal. The metal may be deposited into the line trenches, for example, by physical vapor deposition (sputtering), electroplating, electroless plating, chemical vapor deposition, or a combination thereof. Any portion of the metal overlying the top surfaces of the dielectric layer 130 is removed, for example, by chemical mechanical polishing (CMP), recess etch, or a combination thereof. Additional metal lines (not shown) may be formed at the same level as the first metal line 142 and the second metal line 144 to provide horizontal electrical wiring within the interconnect level structure 131. Additional conductive vias (not shown) may be formed underneath the first metal line 142 and/or the second metal line 144 within the interconnect level structure 131 to provide vertical electrical connection to metal lines (not shown) in the underlying interconnect level structure 111. The thickness of each of the first metal line 141 and the second metal line 144 may be from about 50 nm to about 1,000 nm, and typically from about 100 nm to about 500 nm, although lesser and greater thicknesses are also contemplated herein. The first metal line 142 and the second metal line 144 are separated by a portion of the dielectric layer 130.

Figure 13C:
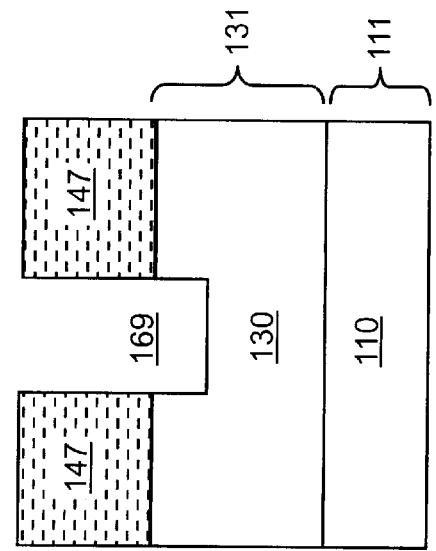
Figure 13A:
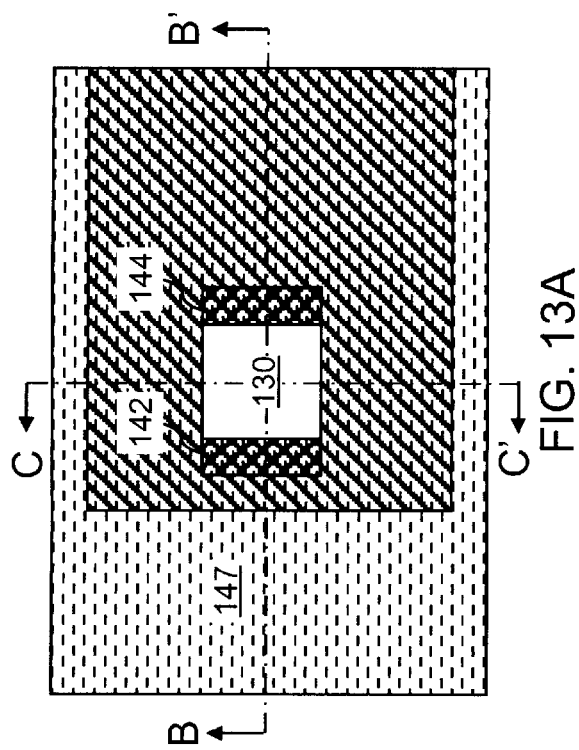
Figure 13B:
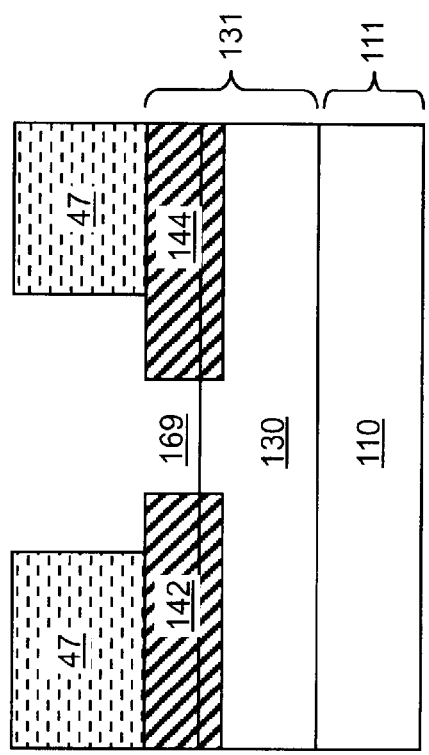

Referring to FIGS. 13A-13C, a photoresist 147 is applied over the top surface of the interconnect level structure 131, and is lithographically patterned to form an opening in the photoresist 147. A lateral boundary between the first metal line 142 and the dielectric layer 130 and another lateral boundary between the second metal line 144 and the second dielectric layer 130 at the top surface of the interconnect level structure 131 are exposed within the area of the opening in the photoresist 147. The area of the opening includes a top surface of the first metal line 142 and the second metal line 144 and a top surface of the dielectric layer 130 around the lateral boundaries. The exposed portion of the dielectric layer 130 laterally abuts the exposed portion of the first metal line 142 and the exposed portion of the second metal line 144.

Employing the photoresist 147, the first metal line 142, and the second metal line 144 as an etch mask, an etch is performed to recess the dielectric layer 130 within the opening of the photoresist 147. The etch may be an anisotropic etch such as a reactive ion etch or an isotropic etch such as a wet etch. The expose portion of the dielectric layer 130 is etched within the opening in the photoresist 147 selective to the first metal line 142 and the second metal line 144. A cavity 169 having an opening at the level of the top surface of the interconnect level structure 131 is formed in the volume of the removed portion of the dielectric layer 130 within the interconnect level structure 131. The depth of the cavity 169, as measured from the top surfaces of the first and second metal lines (142, 144) to the bottom surface of the cavity 169, may be less than the thickness of the first and second metal lines (142, 144). Sidewalls of the first metal line 142, the second metal line 144, and the dielectric layer 130 are exposed after the etch within the cavity 169. The photoresist 147 is subsequently removed. The exposed surfaces of the first metal line 142, the second metal line 144, and the dielectric layer 130 may be cleaned to remove residual polymers from the etch, if any.

Figure 14C:
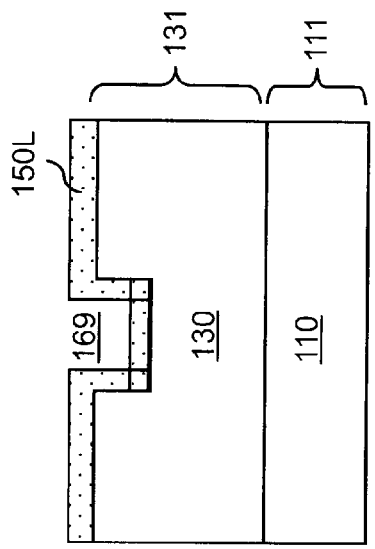
Figure 14A:
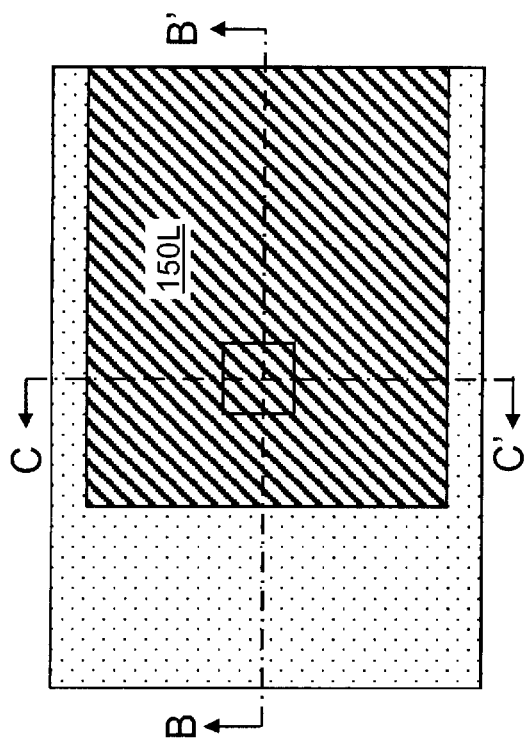
Figure 14B:
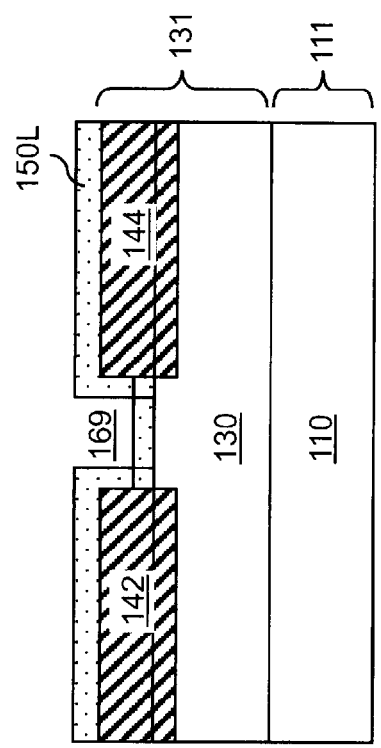

Referring to FIGS. 14A-14C, a semiconductor layer 150L is formed on the exposed surfaces of the first exemplary BEOL semiconductor structure including the top surface and sidewalls of the first metal line 142 and the second metal line 144 and the exposed surfaces of the dielectric layer 130 within the cavity 169. The semiconductor layer 150L comprises a semiconductor material, and may be deposited as an amorphous material or a polycrystalline material. In case the semiconductor layer 150L is deposited as an amorphous material, a suitable anneal at an elevated temperature may be performed to convert the amorphous material into a polycrystalline material to adjust the resistivity of the semiconductor material to a desirable value. The same semiconductor material may be employed for the semiconductor layer 150L as the semiconductor layer 50L of the first and second embodiments.

The semiconductor layer 150L is doped with electrical dopants, i.e., dopants that provide charge carriers in the semiconductor layer 150L to increase the conductivity of the semiconductor layer 150L above the level of conductivity of an intrinsic semiconductor material, which is typically too low and difficult to control for resistive structures with a controlled resistance. The doping of the semiconductor layer 150L may employ the same methods as the doping of the semiconductor layer 50L of the first and second embodiments.

The thickness of the semiconductor layer 150L is set such that the cavity 169 is not completely filled with the semiconductor layer 150L. The thickness of the semiconductor layer 150L may be from about 15 nm to about 500 nm, and typically from about 30 nm to about 150 nm, although lesser and greater thicknesses are also contemplated herein. The thickness of the semiconductor layer 150L may also be optimized for the desired resistance value of a doped semiconductor structure to be subsequently formed.

Referring to FIGS. 15A-15C, an anisotropic etch such as a reactive ion etch (RIE) is employed to form a doped semiconductor spacer 150. The anisotropic etch removes horizontal portions of the semiconductor layer 150L including the portion of the semiconductor layer 150L above the interconnect level structure 131 and the horizontal portion of the semiconductor layer 150L directly on the bottom surface of the cavity 169. A remaining vertical portion of the semiconductor layer 150L, which is formed directly on the sidewalls of the first metal line 142 and the second metal line 144 and the sidewalls of the dielectric layer 130, constitutes the doped semiconductor spacer 150.

The doped semiconductor spacer 150 is a doped semiconductor structure comprising a doped semiconductor material. The doped semiconductor spacer 150 comprises a doped polycrystalline semiconductor material of the semiconductor layer 150L. The doped semiconductor spacer 150 laterally surrounds the cavity 169. A recessed surface of the dielectric layer 130 is exposed underneath the cavity 169. The doped semiconductor spacer 150 laterally abuts the sidewalls of the first metal line 142 and the second metal line 144. The doped semiconductor spacer 150 has at least one pair of substantially parallel sidewalls that directly adjoin the recessed surface of the dielectric layer 130 at the bottom of the cavity 169.

Since the doped semiconductor spacer 150L is formed on the sidewalls of the first metal line 142, the second metal line 144, and the dielectric layer 130 that surround the cavity 169, the doped semiconductor spacer 150 may be ring-shaped, or topologically homeomorphic to a torus in the same manner as the doped semiconductor 50 of the first embodiment of the present invention.

Figure 16C:
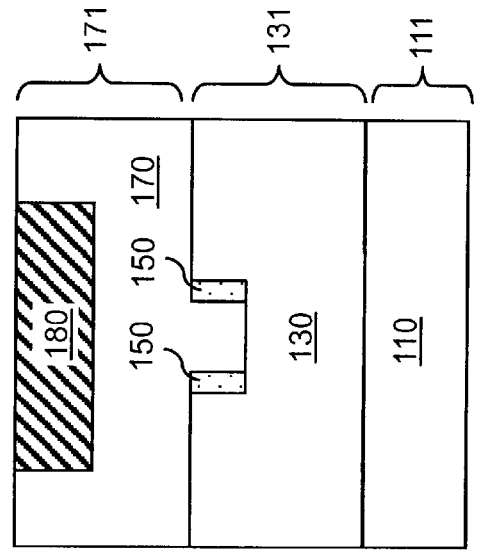
Figure 16A:
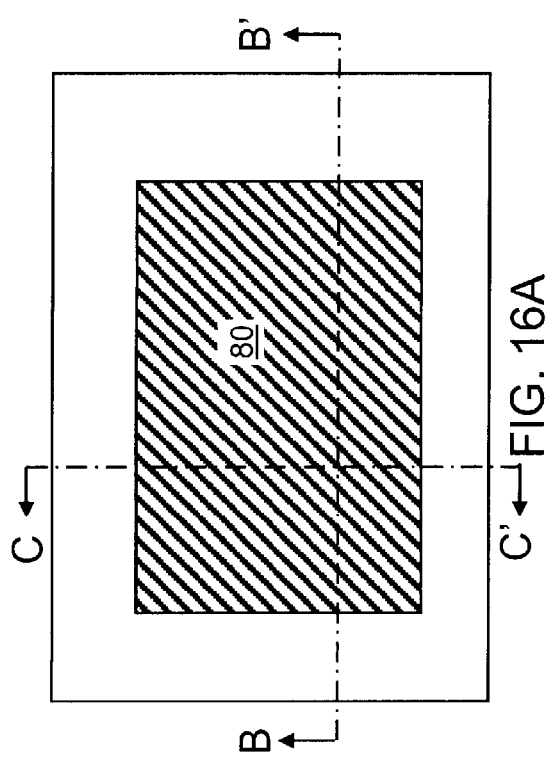
Figure 16B:
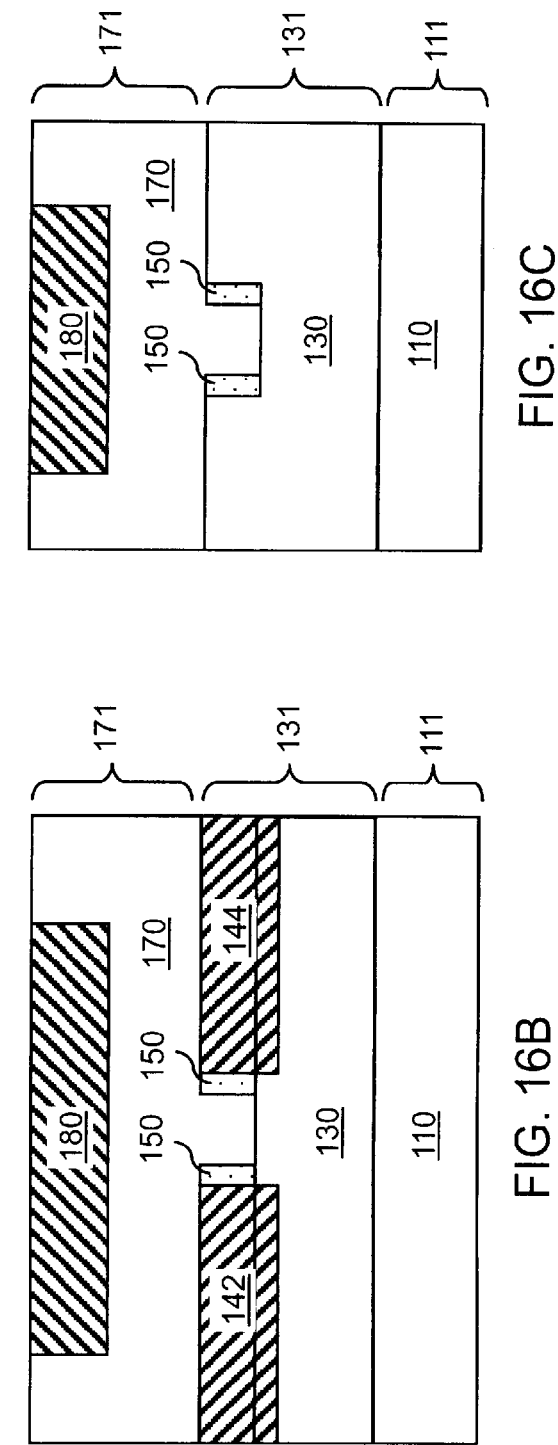

Referring to FIGS. 16A-16C, an overlying dielectric layer 170 is deposited over the top surface of the interconnect level structure 131 and inside the cavity 169. The overlying dielectric layer 170 may comprise any of the dielectric material listed above for the first and second dielectric layers (10, 30) in the first embodiment of the present invention. The same deposition method may be employed to form the overlying dielectric layer 170 as the first and second dielectric layers (10, 30) of the first embodiment of the present invention. A lower portion of the overlying dielectric layer 170, which is the portion of the overlying dielectric layer 170 located beneath the top surface of the first and second metal lines (142, 144) and top surface of the dielectric layer 130, vertically abuts the recessed surface of the dielectric layer 130 and laterally abuts the doped semiconductor spacer 150. In other words, the doped semiconductor spacer 150 laterally abuts and laterally surrounds the lower portion of the overlying dielectric layer 170.

The upper portion of the overlying dielectric layer 170, which is located above the top surface of the at least one second metal line 40 and top surface of the dielectric layer 130, is formed in the same deposition step as the lower portion of the overlying dielectric layer 170. The upper portion of the overlying dielectric layer 170 and the lower portion of the overlying dielectric layer 170 comprise the same dielectric material and are of integral construction without any physically manifested interface therebetween.

At least one third metal line 180 and at least one conductive via (not shown) may be formed in the upper portion of the overlying dielectric layer 170. The upper portion of the overlying dielectric layer 170 above the top surface of the interconnect level structure 131, the at least one third metal line 80, and the at least one conductive via embedded in the upper portion of the overlying dielectric layer 170 collectively constitute an overlying interconnect level structure 171. The overlying interconnect level structure 171 is located directly on, and above the top surface of, the interconnect level structure 131.

Figure 17:
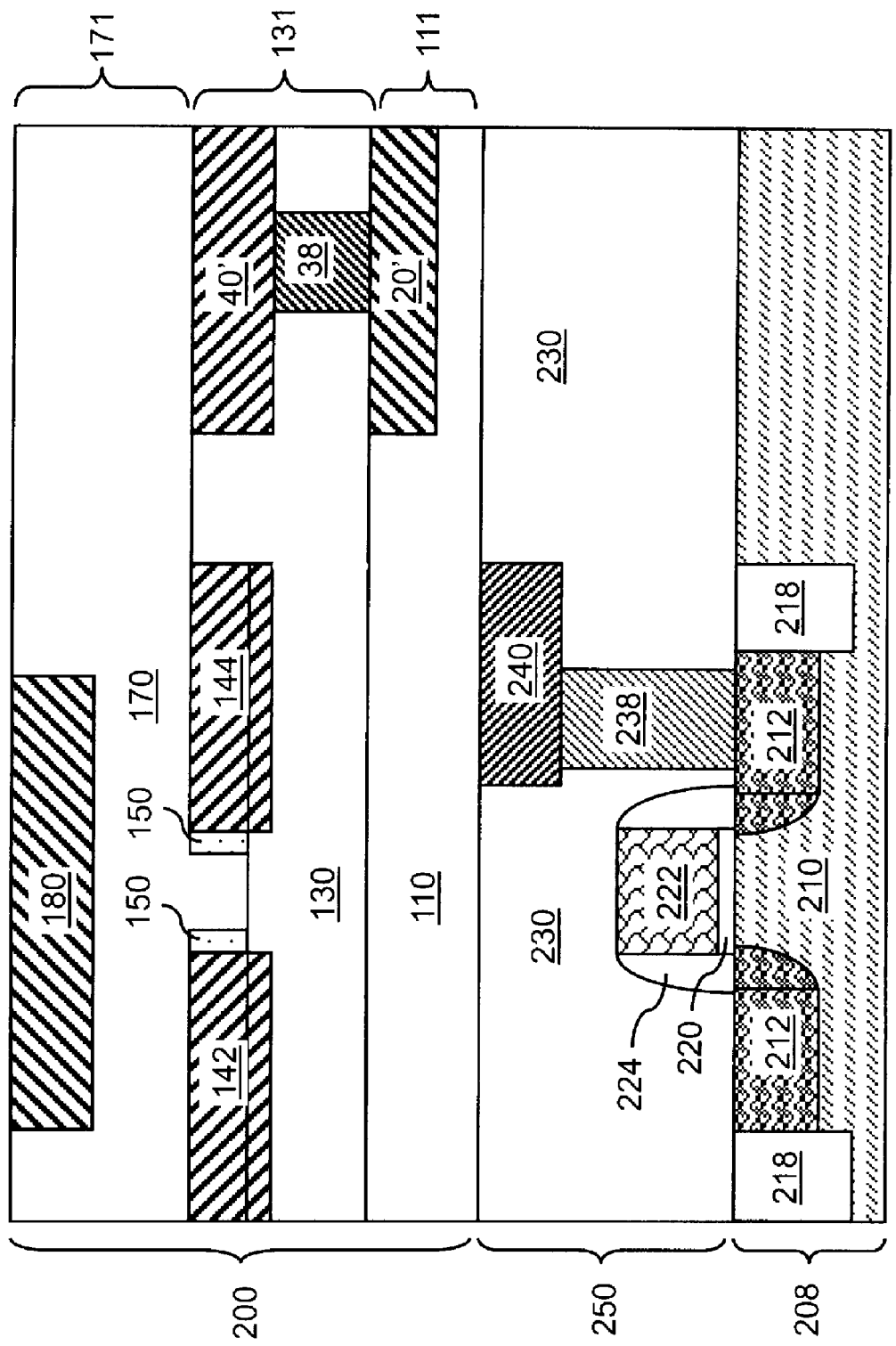
FIG. 17 is a vertical cross-sectional view of a third exemplary semiconductor structure incorporating the third exemplary BEOL semiconductor structure.

Referring to FIG. 17, a third exemplary semiconductor structure according to the third embodiment of the present invention is shown, which incorporates the third exemplary BEOL semiconductor structure 200. The third exemplary semiconductor structure includes the third exemplary BEOL semiconductor structure 200 of FIGS. 16A-16C, at least another first metal line 20' embedded in the underlying dielectric layer 110, at least one interconnect via 38 embedded in the dielectric layer 130 and vertically abutting the at least another first metal line 20', and at least one additional metal line 40' embedded in the dielectric layer 130. The at least one additional metal line 40' is located at the same level as the first metal line 142 and the second metal line 144, and vertically abuts the overlying interconnect level structure 171. The underlying interconnect level structure 111 may include at least another interconnect via (not shown) that electrically connects the at least another first metal line 20' to a conductive structure or device underneath.

In one case, the interconnect level structure 131 may be completely filled with the dielectric layer 130, the first metal line 142, the second metal line 144, the doped semiconductor spacer 150, the lower portion of the overlying dielectric layer 170, the at least one additional metal line 40', and the at least one interconnect via 38.

The third exemplary semiconductor structure further comprises a semiconductor substrate 208 and a first BEOL level structure 250 located underneath the first exemplary BEOL semiconductor structure 200. The first BEOL level structure 250 and the semiconductor substrate 208 may be substantially the same as described in the first and second embodiments of the present invention.

The doped semiconductor spacer 150 functions as a resistive link for a resistor or an electrical fuse in the same manner as in the first and second embodiments. Since the doped semiconductor spacer 150 is formed within an interconnect level structure, and not in the semiconductor substrate 208 or on the surface of the semiconductor layer 210, the doped semiconductor spacer 150 is not a FEOL device and does not occupy any volume in or directly on the semiconductor substrate 208. Thus, more other FEOL devices may be formed on the semiconductor substrate 208 by forming the doped semiconductor structure 150 as a resistive device element in the BEOL, thereby enabling higher density semiconductor structures.

Referring to FIGS. 18A-18C, a fourth exemplary BEOL semiconductor structure according to a fourth embodiment of the present invention is derived from the third exemplary BEOL semiconductor structure of FIGS. 13A-13C. After forming the structure shown in FIGS. 13A-13C and prior to removing the photoresist 147, an additional etch is performed to recess the bottom surface of the cavity 19 below the level of the bottom surfaces of the first metal line 142 and the second metal line 144. The etch may be anisotropic or substantially isotropic. In case the etch is anisotropic, the cavity 169 may include sidewalls of the dielectric layer 130 that is located underneath the bottom surfaces of the first and second metal lines (142, 144) and substantially vertically coincident with the sidewalls of the exposed portions of the first and second metal lines (142, 144). The bottom surface of the cavity 169 is recessed to a depth between the bottom surfaces of the first and second metal lines (142, 144) and the top surface of the underlying interconnect level structure 111. The cavity 169 is vertically extended. If the etch is substantially isotropic, the cavity 169 may also be laterally extended.

After removing the photoresist 147 (See FIGS. 13A-13C), a semiconductor layer (not shown) is formed on the exposed surfaces of the fourth exemplary BEOL semiconductor structure including the top surfaces and sidewalls of the first metal line 142 and the second metal line 144, the top surface of the dielectric layer 130, and the sidewalls and the recessed surface of the dielectric layer 130 in the cavity 169. The semiconductor layer of the fourth embodiment may be substantially the same as the semiconductor layer 150L of the third embodiment of the present invention described above. The thickness of the semiconductor layer is set such that the cavity 169 is not completely filled with the semiconductor layer.

An anisotropic etch is performed on the doped semiconductor layer to form a doped semiconductor spacer 150. The doped semiconductor spacer 150 is a doped semiconductor structure comprising a doped semiconductor material. The doped semiconductor spacer 150 comprises a doped polycrystalline semiconductor material of the semiconductor layer 150L. The doped semiconductor spacer 150 laterally surrounds the cavity 169. If the cavity extends to the bottom of the interconnect level structure 131, a top surface of the underlying interconnect level structure 111 such as the underlying dielectric layer 110 may be exposed underneath the cavity 169. If the bottom surface of the cavity 169 is located above the bottom surface of the interconnect level structure 131, a recessed surface of the dielectric layer 130 is exposed at the bottom of the cavity 169. The doped semiconductor spacer 150 laterally abuts the sidewalls of the first metal line 142 and the second metal line 144 to provide a resistive link therebetween.

Since the doped semiconductor spacer 150L is formed on the sidewalls of the first metal line 142, the second metal line 144, and the dielectric layer 130 that surround the cavity 169, the doped semiconductor spacer 150 may be ring-shaped, or topologically homeomorphic to a torus in the same manner as the doped semiconductor 50 of the first embodiment of the present invention.

Referring to FIGS. 19A-19C, an overlying dielectric layer 170 is deposited over the top surface of the interconnect level structure 131 and inside the cavity 169. The overlying dielectric layer 170 may comprise any of the dielectric material listed above for the first and second dielectric layers (10, 30) in the first embodiment of the present invention. The same deposition method may be employed to form the overlying dielectric layer 170 as the first and second dielectric layers (10, 30) of the first embodiment of the present invention. A lower portion of the overlying dielectric layer 170, which is the portion of the overlying dielectric layer 170 located beneath the top surface of the first and second metal lines (142, 144) and top surface of the dielectric layer 130, vertically abuts the recessed surface of the dielectric layer 130 or the top surface of the underlying interconnect level structure 111 depending on the depth of the cavity 169 (See FIGS. 18A-18C). The lower portion of the overlying dielectric layer 170 also laterally abuts the doped semiconductor spacer 150. Thus, the doped semiconductor spacer 150 laterally abuts and laterally surrounds the lower portion of the overlying dielectric layer 170.

The upper portion of the overlying dielectric layer 170, which is located above the top surface of the at least one second metal line 40 and top surface of the dielectric layer 130, is formed in the same deposition step as the lower portion of the overlying dielectric layer 170. The upper portion of the overlying dielectric layer 170 and the lower portion of the overlying dielectric layer 170 comprise the same dielectric material and are of integral construction without any physically manifested interface therebetween.

At least one third metal line 180 and at least one conductive via (not shown) may be formed in the upper portion of the overlying dielectric layer 170. The upper portion of the overlying dielectric layer 170 above the top surface of the interconnect level structure 131, the at least one third metal line 80, and the at least one conductive via embedded in the upper portion of the overlying dielectric layer 170 collectively constitute an overlying interconnect level structure 171. The overlying interconnect level structure 171 is located directly on, and above the top surface of, the interconnect level structure 131.

Figure 20:
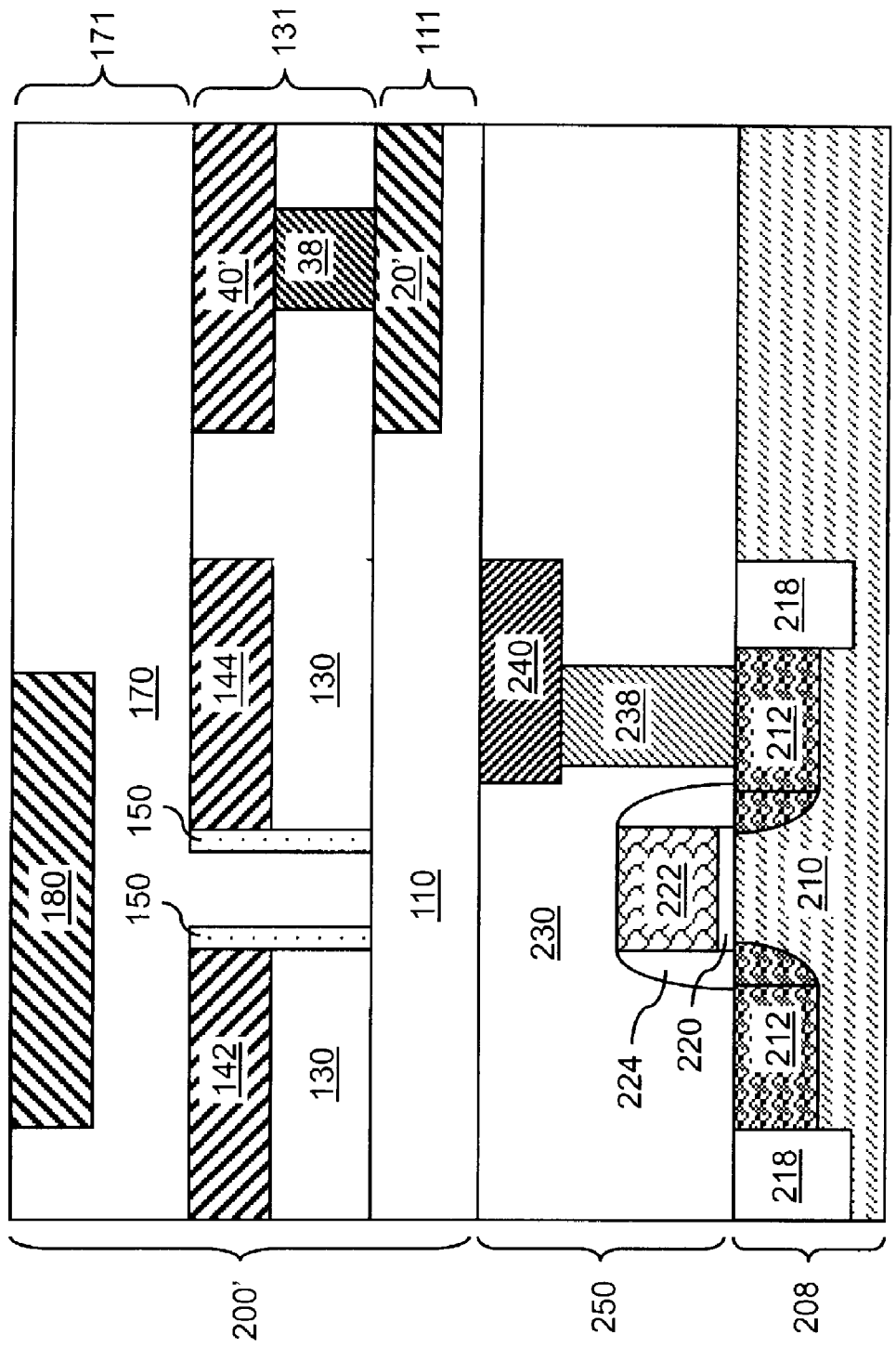
FIG. 20 is a vertical cross-sectional view of a fourth exemplary semiconductor structure incorporating the fourth exemplary BEOL semiconductor structure.

Referring to FIG. 20, a fourth exemplary semiconductor structure according to the fourth embodiment of the present invention is shown, which incorporates the fourth exemplary BEOL semiconductor structure 200'. The fourth exemplary semiconductor structure includes the fourth exemplary BEOL semiconductor structure 200' of FIGS. 19A-19C, at least another first metal line 20' embedded in the underlying dielectric layer 110, at least one interconnect via 38 embedded in the dielectric layer 130 and vertically abutting the at least another first metal line 20', and at least one additional metal line 40' embedded in the dielectric layer 130. The at least one additional metal line 40' is located at the same level as the first metal line 142 and the second metal line 144, and vertically abuts the overlying interconnect level structure 171. The underlying interconnect level structure 111 may include at least another interconnect via (not shown) that electrically connects the at least another first metal line 20' to a conductive structure or device underneath.

In one case, the interconnect level structure 131 may be completely filled with the dielectric layer 130, the first metal line 142, the second metal line 144, the doped semiconductor spacer 150, the lower portion of the overlying dielectric layer 170, the at least one additional metal line 40', and the at least one interconnect via 38.

The fourth exemplary semiconductor structure further comprises a semiconductor substrate 208 and a first BEOL level structure 250 located underneath the fourth exemplary BEOL semiconductor structure 200'. The first BEOL level structure 250 and the semiconductor substrate 208 may be substantially the same as described in the first through third embodiments of the present invention. The doped semiconductor spacer 150 functions as a resistive link for a resistor or an electrical fuse in the same manner as in the third embodiment.

Figure 21C:
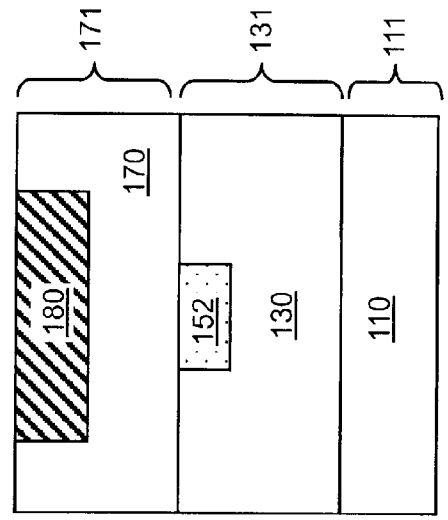
FIGS. 21A-21C are views of a fifth exemplary BEOL semiconductor structure according to a fifth embodiment of the present invention.
Figure 21A:
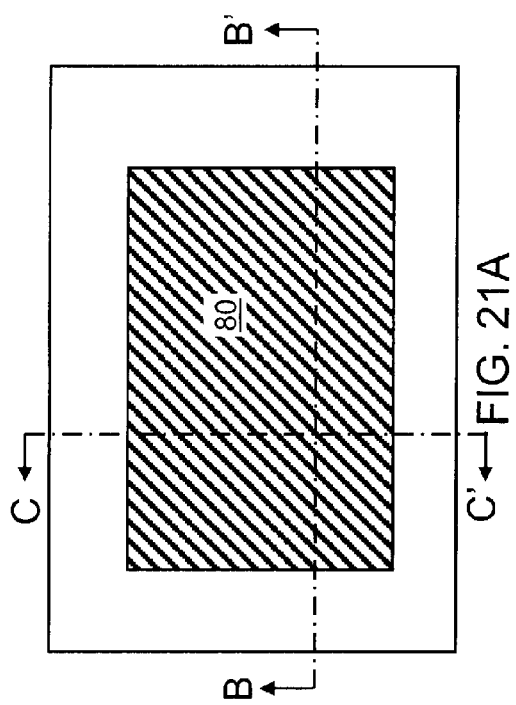
Figure 21B:
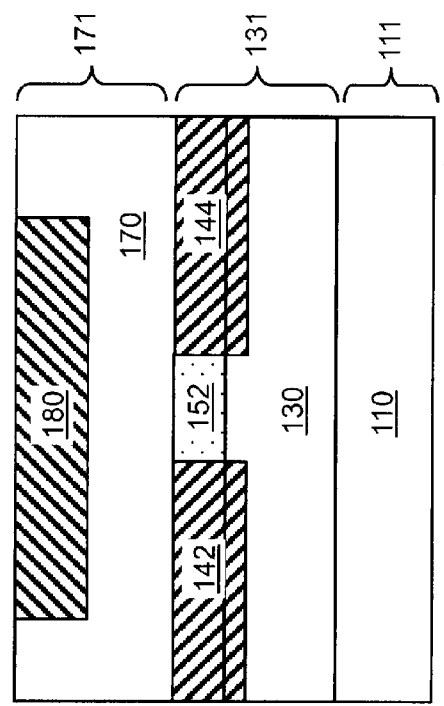

Referring to FIGS. 21A-21C, a fifth exemplary BEOL semiconductor structure according to a fifth embodiment of the present invention is derived from the third exemplary BEOL semiconductor structure of FIGS. 13A-13C. After forming the structure shown in FIGS. 13A-13C, the photoresist 147 is removed. Optionally, the 169 may further be recessed prior to removal of the photoresist as in the fourth embodiment of the present invention.

A semiconductor layer (not shown) is formed on the top surface and sidewalls of the first metal line 142 and the second metal line 144 and the exposed surfaces of the dielectric layer 130 within the cavity 169. The semiconductor layer of the fifth embodiment comprises the same semiconductor material as the semiconductor layer 50L or the semiconductor layer 150L of the first through fourth embodiment. Particularly, the semiconductor layer is doped with electrical dopants to provide the same level of resistivity as in the first through fourth embodiments.

The thickness of the semiconductor layer is set such that the cavity 169 is completely filled with the semiconductor layer. The thickness of the semiconductor layer may be from about 50 nm to about 2,000 nm, and typically from about 100 nm to about 1,000 nm, although lesser and greater thicknesses are also contemplated herein.

The semiconductor layer is subsequently planarized to the level of the top surface of the interconnect level structure 131, i.e., the top surface of the first and second metal lines (142, 144). Chemical mechanical planarization (CMP), a recess etch, or a combination thereof may be employed to remove the excess material of the semiconductor layer from above the top surface of the interconnect level structure 131. The remaining vertical portion of the semiconductor layer located beneath the top surface of the interconnect level structure 131 constitutes a doped semiconductor plug 152.

The doped semiconductor plug 152 is a doped semiconductor structure comprising a doped semiconductor material. The doped semiconductor plug 152 comprises a doped polycrystalline semiconductor material of the semiconductor layer. The doped semiconductor plug 152 completely fills the cavity 169 (See FIGS. 13A-13C). The doped semiconductor plug 152 laterally abuts the sidewalls of the first and second metal lines (142, 144) and the sidewalls of the dielectric layer 130. The doped semiconductor plug 152 may vertically abuts the top surface of the underlying interconnect level structure 111 or a recessed surface of the dielectric layer 130 depending on the depth of the cavity 169 (See FIGS. 13A-13C). The doped semiconductor plug 152 has a top surface that is substantially coplanar with the top surface of the interconnect level structure 131.

An overlying interconnect level structure 171 including an overlying third dielectric layer 170 is formed over the top surface of the interconnect level structure 131 in the same manner as in the third and fourth embodiment of the present invention.

Figure 22:
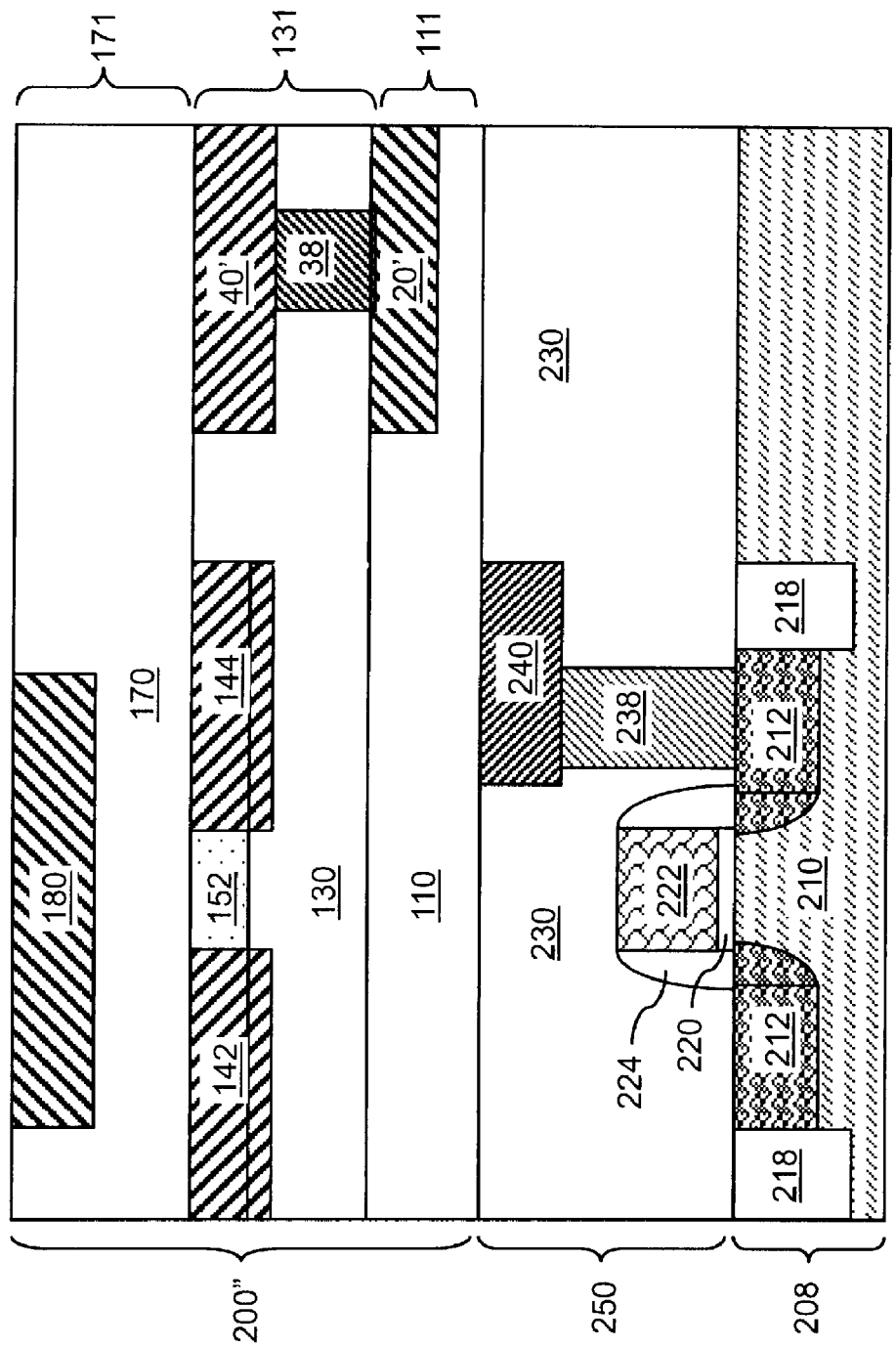
FIG. 22 is a vertical cross-sectional view of a fifth exemplary semiconductor structure incorporating the fifth exemplary BEOL semiconductor structure.

Referring to FIG. 22, a fifth exemplary semiconductor structure is shown, which incorporates the fifth exemplary BEOL semiconductor structure 200". The fifth exemplary semiconductor structure includes the fifth exemplary BEOL semiconductor structure 200" of FIGS. 21A-21C, at least another first metal line 20' embedded in the underlying dielectric layer 110, at least one interconnect via 38 embedded in the dielectric layer 130 and vertically abutting the at least another first metal line 20', and at least one additional metal line 40' embedded in the dielectric layer 130. The at least one additional metal line 40' is located at the same level as the first metal line 142 and the second metal line 144, and vertically abuts the overlying interconnect level structure 171. The underlying interconnect level structure 111 may include at least another interconnect via (not shown) that electrically connects the at least another first metal line 20' to a conductive structure or device underneath.

In one case, the interconnect level structure 131 may be completely filled with the dielectric layer 130, the first metal line 142, the second metal line 144, the doped semiconductor spacer 150, the lower portion of the overlying dielectric layer 170, the at least one additional metal line 40', and the at least one interconnect via 38.

The fifth exemplary semiconductor structure further comprises a semiconductor substrate 208 and a first BEOL level structure 250 located underneath the fifth exemplary BEOL semiconductor structure 200". The first BEOL level structure 250 and the semiconductor substrate 208 may be substantially the same as described in the first through fourth embodiments of the present invention. The doped semiconductor plug 152 functions as a resistive link for a resistor or an electrical fuse in the same manner as in the third and fourth embodiments.

Figure 23:
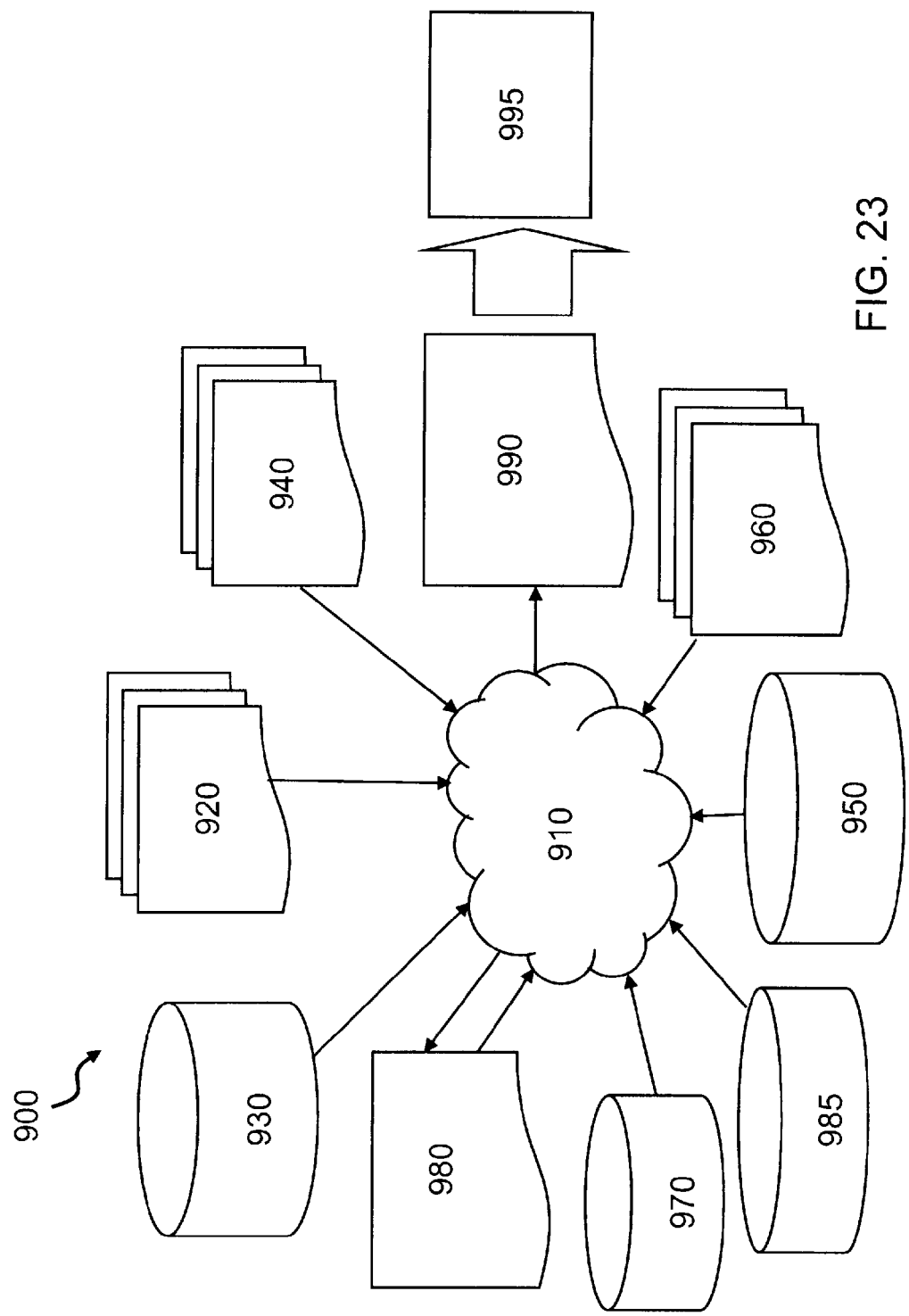
FIG. 23 is a flow diagram of a design process used in semiconductor design and manufacture of the semiconductor structures according to the present invention.

FIG. 23 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1A-6C, 7, 8A-10C, 11, 12A-16C, 17, 18A-19C, 20, 21A-21C, and 22. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 23 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1A-6C, 7, 8A-10C, 11, 12A-16C, 17, 18A-19C, 20, 21A-21C, and 22. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1A-6C, 7, 8A-10C, 11, 12A-16C, 17, 18A-19C, 20, 21A-21C, and 22 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-6C, 7, 8A-10C, 11, 12A-16C, 17, 18A-19C, 20, 21A-21C, and 22. In one embodiment, design structure 990 may comprise a compiled, executable HDL simulation model that functionally simulates the devices shown in FIGS. 1A-6C, 7, 8A-10C, 11, 12A-16C, 17, 18A-19C, 20, 21A-21C, and 22.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-6C, 7, 8A-10C, 11, 12A-16C, 17, 18A-19C, 20, 21A-21C, and 22. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a first interconnect level structure including a first dielectric layer and a first metal line embedded therein;
    a second interconnect level structure vertically abutting said first interconnect level structure and including a second dielectric layer and at least one second metal line embedded therein, wherein none of said at least one second metal line contacts said first metal line; and
    a doped semiconductor structure laterally abutting said at least one second metal line and vertically abutting said first metal line.

2. The semiconductor structure of claim 1, wherein said doped semiconductor structure is a doped semiconductor spacer having a pair of substantially parallel sidewalls that directly adjoin said first metal line.

3. The semiconductor structure of claim 2, wherein said doped semiconductor spacer comprises doped polysilicon, a doped silicon-containing alloy, a doped germanium-containing alloy, or a doped compound semiconductor material.

4. The semiconductor structure of claim 2, further comprising a third interconnect level structure vertically abutting said second interconnect level structure and including an upper portion of a third dielectric layer, wherein a lower portion of said third dielectric layer vertically abuts said first metal line.

5. The semiconductor structure of claim 4, wherein said lower portion of said third dielectric layer laterally abuts said doped semiconductor spacer.

6. The semiconductor structure of claim 4, wherein said upper portion of said third dielectric layer and said lower portion of said third dielectric layer is of integral construction without a physically manifested interface therebetween.

7. The semiconductor structure of claim 4, further comprising:
    at least one additional metal line embedded in said second dielectric layer;
    at least one interconnect via embedded in said second dielectric layer and vertically abutting said at least another second metal line; and
    at least another first metal line embedded in said first dielectric layer and vertically abutting said at least one interconnect via.

8. The semiconductor structure of claim 7, wherein said second interconnect level structure is completely filled with said second dielectric layer, said at least one second metal line, said doped semiconductor spacer, said lower portion of said third dielectric layer, said at least one additional metal line, and said at least one interconnect via.

9. The semiconductor structure of claim 1, wherein said doped semiconductor structure is polycrystalline and comprises one of silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials.

10. The semiconductor structure of claim 1, further comprising:
    a semiconductor substrate located underneath said first interconnect level structure; and
    at least one semiconductor device located directly on said semiconductor substrate and underneath said first interconnect level structure.

11. The semiconductor structure of claim 1, wherein said doped semiconductor structure does not extend above a topmost surface of said first metal line and said second metal line, and does not extend below a bottommost surface of said first metal line and said metal low.

12. A semiconductor structure comprising:
    a first interconnect level structure including a first dielectric layer and a first metal line embedded therein;

a second interconnect level structure vertically abutting said first interconnect level structure and including a second dielectric layer and at least one second metal line embedded therein; and a doped semiconductor structure laterally abutting said at least one second metal line and vertically abutting said first metal line, wherein said doped semiconductor structure comprises a doped semiconductor plug having a top surface that is substantially coplanar with a top surface of said at least one second metal line.

13. The semiconductor structure of claim 12, further comprising a third interconnect level structure vertically abutting said second interconnect level structure and including a third dielectric layer, wherein a top surface of said at least one second metal line, a top surface of said doped semiconductor plug, and a top surface of said second dielectric layer vertically abut a bottom surface of said third dielectric layer.

14. A semiconductor structure comprising:

an interconnect level structure including a dielectric layer and first and second metal lines embedded therein; and a doped semiconductor structure laterally abutting said first metal line and said second metal line.

15. The semiconductor structure of claim 14, wherein said doped semiconductor structure is a doped semiconductor spacer that is topologically homeomorphic to a torus.

16. The semiconductor structure of claim 15, further comprising another interconnect level structure vertically abutting said interconnect level structure and including an upper portion of a another dielectric layer, wherein a lower portion of said other dielectric layer laterally abuts said doped semiconductor spacer.

17. The semiconductor structure of claim 16, further comprising:

at least one additional metal line embedded in said dielectric layer; and at least one interconnect via embedded in said second dielectric layer and vertically abutting said at least another second metal line.

18. The semiconductor structure of claim 17, wherein said interconnect level structure is completely filled with said dielectric layer, said first metal line, said second metal line, said doped semiconductor spacer, said lower portion of said other dielectric layer, said at least one additional metal line, and said at least one interconnect via.

19. The semiconductor structure of claim 14, wherein said doped semiconductor structure comprises a doped semiconductor plug having a top surface that is substantially coplanar with a top surface of said first metal line and said second metal line.

20. A semiconductor structure comprising:

a first interconnect level structure including a first dielectric layer and a first metal line embedded therein;

a second interconnect level structure vertically abutting said first interconnect level structure and including a second dielectric layer and at lest one second metal line embedded therein;

a doped semiconductor structure laterally abutting said at least one second metal line and vertically abutting said first metal line; and a third dielectric layer of integral construction and including an upper portion and a lower portion, wherein said upper portion overlies said second interconnect level structure and said doped semiconductor structure laterally contacts and surrounds said lower portion.

* * * * *